(12) United States Patent
Hwang et al.

(10) Patent No.: US 10,720,474 B2
(45) Date of Patent: Jul. 21, 2020

(54) ELECTRONIC DEVICE

(71) Applicant: LG Display Co., Ltd., Seoul (KR)

(72) Inventors: JongHee Hwang, Goyang-si (KR); BuYeol Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 161 days.

(21) Appl. No.: 15/699,697

(22) Filed: Sep. 8, 2017

(65) Prior Publication Data
US 2018/0166507 A1 Jun. 14, 2018

(30) Foreign Application Priority Data
Dec. 9, 2016 (KR) .......... 10-2016-0167768

(51) Int. Cl.
*H01L 27/32* (2006.01)
*G06F 3/041* (2006.01)
*G06F 3/044* (2006.01)

(52) U.S. Cl.
CPC .......... *H01L 27/323* (2013.01); *G06F 3/041* (2013.01); *G06F 3/044* (2013.01); *G06F 3/0412* (2013.01); *G06F 3/0414* (2013.01); *G06F 3/0416* (2013.01); *H01L 27/3272* (2013.01); *G06F 2203/04107* (2013.01)

(58) Field of Classification Search
None
See application file for complete search history.

(56) References Cited

U.S. PATENT DOCUMENTS

| | | |
|---|---|---|
| 2009/0058250 A1 | 3/2009 | Sin et al. |
| 2010/0265206 A1 | 10/2010 | Chen |
| 2014/0049522 A1 | 2/2014 | Mathew et al. |
| 2015/0049263 A1 | 2/2015 | Chu et al. |
| 2015/0091849 A1* | 4/2015 | Ludden ............. G06F 3/0412 345/174 |
| 2015/0153881 A1 | 6/2015 | Misaki |
| 2015/0355771 A1 | 12/2015 | Watazu et al. |
| 2016/0179264 A1 | 6/2016 | Harley |
| 2017/0083140 A1* | 3/2017 | Leng ................. G06F 3/044 |
| 2017/0277296 A1* | 9/2017 | Reynolds ........... G06F 3/044 |
| 2017/0321087 A1 | 11/2017 | Moon et al. |

FOREIGN PATENT DOCUMENTS

| | | |
|---|---|---|
| CN | 205788139 U | 12/2016 |
| JP | 2009-58959 A | 3/2009 |
| JP | 2015-166889 A | 9/2015 |
| JP | WO2015/156196 A1 | 10/2015 |
| JP | 2016-153963 A | 8/2016 |
| TW | 201439854 A | 10/2014 |

(Continued)

*Primary Examiner* — Stephen T. Reed
(74) *Attorney, Agent, or Firm* — Birch, Stewart, Kolasch & Birch, LLP

(57) ABSTRACT

An electronic device can include: a pixel array layer disposed on a substrate and including a plurality of pixels, each of the plurality of pixels including a thin film transistor and an organic light emitting device; an encapsulation layer covering the pixel array layer; a shielding layer disposed on the encapsulation layer; and a touch sensing layer disposed on the shielding layer to sense coordinates of a touch input, in which the touch sensing layer includes a pressure response member for sensing a touch force of the touch input.

19 Claims, 13 Drawing Sheets

(56) References Cited

FOREIGN PATENT DOCUMENTS

| | | |
|---|---|---|
| TW | 201508568 A | 3/2015 |
| TW | M527573 U | 8/2016 |
| TW | 201633088 A | 9/2016 |
| WO | WO 2014/035479 A2 | 3/2014 |
| WO | WO 2014/065001 A1 | 5/2014 |
| WO | WO 2014/092049 A1 | 5/2014 |
| WO | WO 2014/192786 A1 | 12/2014 |
| WO | WO 2015/04119 A1 | 3/2015 |

* cited by examiner

ELECTRONIC DEVICE

CROSS REFERENCE TO RELATED APPLICATIONS

This application claims the priority benefit of the Korean Patent Application No. 10-2016-0167768 filed in the Republic of Korea on Dec. 9, 2016, which is hereby incorporated by reference as if fully set forth herein.

BACKGROUND OF THE INVENTION

Field of the Disclosure

Embodiments of the present disclosure relate to an electronic device with a touch screen.

Discussion of the Related Art

A touch screen is a type of input device, which is applied to an image display device such as liquid crystal display (LCD) device, field emission display (FED), plasma display panel (PDP), electroluminescent display (ELD), electrophoretic display (EPD), organic light emitting display device, etc., and enables a user to input information by directly touching a screen with a finger, a pen, or the like while looking at the screen of the image display device.

The touch screen is generally used as the input device for various kinds of products such as television, notebook computer and monitor as well as portable electronic devices such as electronic notebook, electronic book (e-book), PMP (Portable Multimedia Player), navigation, UMPC (Ultra Mobile PC), mobile phone, smart phone, smart watch, tablet PC (tablet Personal Computer), watch phone, and mobile communication terminal.

Recently, with an establishment of a user interface environment such as application which requires three-dimensional (3D) touch information in accordance with a touch force level as well as two-dimensional (2D) touch information in accordance with a touch position, an organic light emitting display device having a force touch function and an electronic device comprising the same, for example, a smart phone have been developed and studied.

A related art electronic device having a force touch function generates two-dimensional touch information in accordance with a touch position by sensing a capacitance change in a touch electrode of a touch panel provided on an organic light emitting display panel, and generates three-dimensional touch information in accordance with a touch force by sensing a gap change between a housing and a force sensor attached to a rear surface of the organic light emitting display panel.

However, the related art electronic device is very thick and bulky due to a thickness of the force sensor and a gap between the force sensor and the housing.

SUMMARY OF THE INVENTION

Accordingly, embodiments of the present disclosure are directed to an electronic device that substantially obviates one or more problems due to limitations and disadvantages of the related art.

An aspect of an embodiment of the present disclosure is directed to providing an electronic device with a small thickness, which is capable of sensing both a touch position and a touch force.

Another aspect of an embodiment of the present disclosure is directed to providing an electronic device which is capable of sensing both a touch position and a touch force without being influenced by noise.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an electronic device that can include a housing having a receiving space, a display module received in the receiving space, a cover window supported by the housing so as to cover the display module, in which the display module can include a pixel array layer including a plurality of pixels, in which the pixel array layer is prepared on a substrate, and each pixel includes a thin film transistor and an organic light emitting device, an encapsulation layer for covering the pixel array layer, a shielding layer prepared on the encapsulation layer, and a touch sensing layer prepared on the shielding layer.

In addition, the shielding layer can include a transparent conductive layer, and a metal pattern layer prepared on the transparent conductive layer.

Also, the metal pattern layer can include a plurality of concentric patterns or a plurality of concentric polygon patterns prepared on one surface of the transparent conductive layer.

Also, the touch sensing layer can include a pressure response member prepared on the shielding layer, a first touch electrode prepared on a first surface of the pressure response member confronting/facing the shielding layer, and a second touch electrode prepared on a second surface of the pressure response member, in which the second surface of the pressure response member is opposite to the first surface of the pressure response member.

Also, the pressure response member can include a piezoelectric material or a piezoresistive material.

In addition, the piezoelectric material can include any one among PVDF (polyvinylidene difluoride), PZT (Lead Zirconate Titanate), PLLA (Poly-L-Lactide), Nylon, and Parylene-C.

Also, the piezoresistive material can include polymer and conductive filler, in which the conductive filler can include any one among nickel (Ni), copper (Cu), argentums (Ag), aluminum (Al), ferrum (Fe), vanadium oxide ($V_2O_3$), titanium oxide (TiO), carbon black, graphite, graphene, and carbon nanotube (CNT).

The shielding layer can include a transparent conductive layer, and a line pattern prepared on the transparent conductive layer, in which the line pattern can be overlapped with the second touch electrode while being parallel to the second touch electrode.

Furthermore, the electronic device can include a touch driving circuit connected with the shielding layer and the touch sensing layer, in which the touch driving circuit drives the touch sensing layer by a time-division method including a first touch sensing period and a second touch sensing period, and in which the touch driving circuit supplies a touch driving signal to at least one of the first touch electrode and the second touch electrode, and senses touch sensing data through the remaining touch electrode of the first touch electrode and the second touch electrode for the first touch sensing period, and the touch driving circuit supplies a force driving voltage to any one of the first touch electrode and the shielding layer, and senses force sensing data through the remaining of the first touch electrode and the shielding layer for the second touch sensing period.

In addition, the shielding layer can be electrically floating or grounded by the touch driving circuit according to one embodiment of the present disclosure for the first touch sensing period, and the second touch electrode can be electrically floating or grounded by the touch driving circuit during the second touch sensing period.

The force driving voltage according to one embodiment of the present disclosure can be a ground voltage.

both the foregoing general description and the following detailed description of embodiments of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
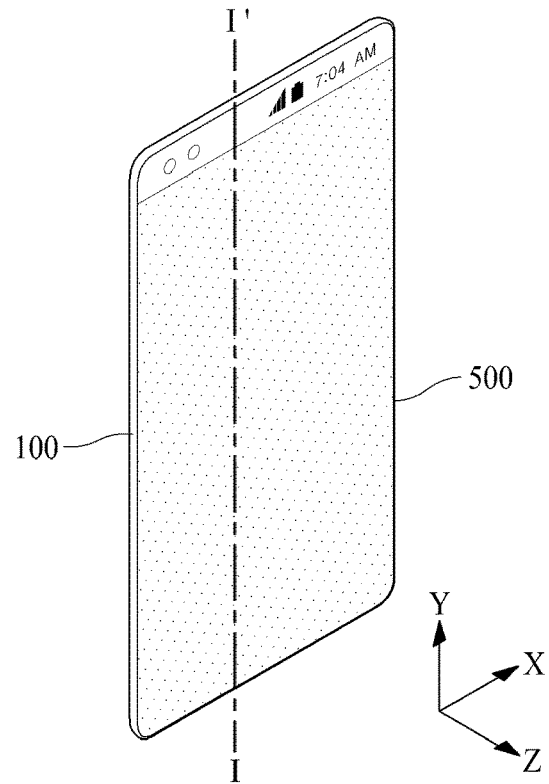
FIG. 1 is a perspective view illustrating an electronic device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings illustrating embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," "have," and "include" are used in the present specification, another part can be added unless "only" is used. The terms of a singular form can include plural forms unless referred to the contrary.

In construing an element, the element is construed as including an error region although there is no explicit description.

In describing a position relationship, for example, when the positional order is described as "on," "above," "below" and "next" a situation which is not in contact may be included unless "just" or "direct" is used.

In describing a time relationship, for example, when the temporal order is described as "after," "subsequent," "next," and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "first horizontal axis direction," "second horizontal axis direction," and "vertical axis direction" are not limited to a perpendicular geometric configuration. That is, "first horizontal axis direction", "second horizontal axis direction," and "vertical axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be performed independently from each other, or can be performed together in co-dependent relationship.

Hereinafter, an electronic device according to the embodiment of the present disclosure will be described in detail with reference to the accompanying drawings. Wherever possible, the same reference numbers will be used throughout the drawings to refer to the same or like parts.

Figure 2:
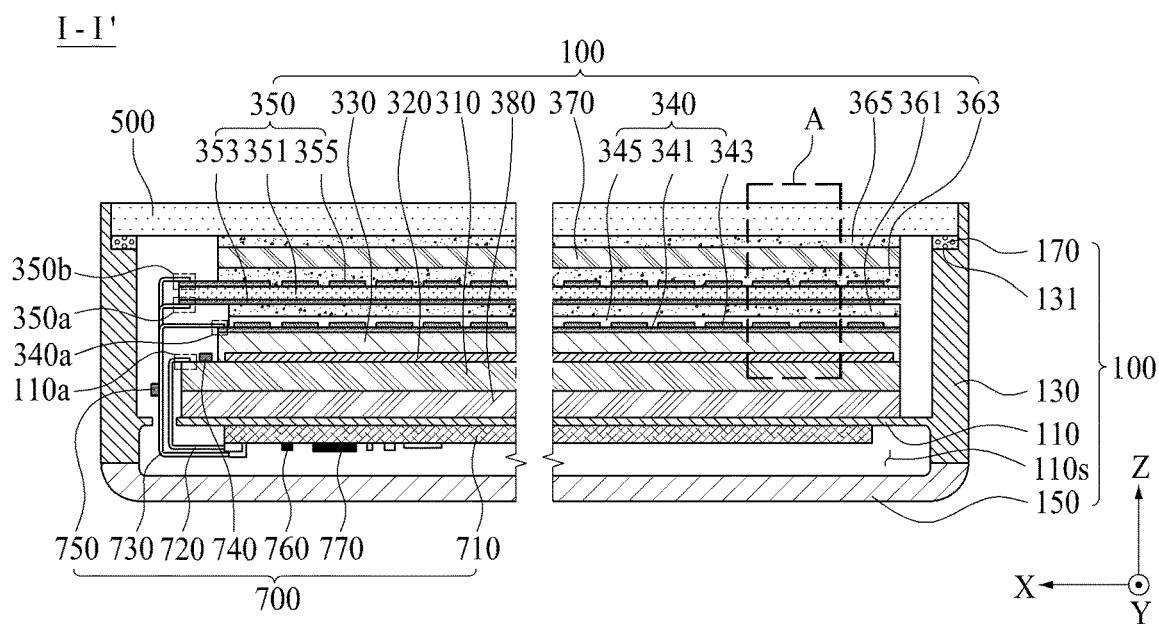
FIG. 2 is a cross sectional view along I-I' line of FIG. 1 according to an embodiment of the present disclosure.
Figure 3:
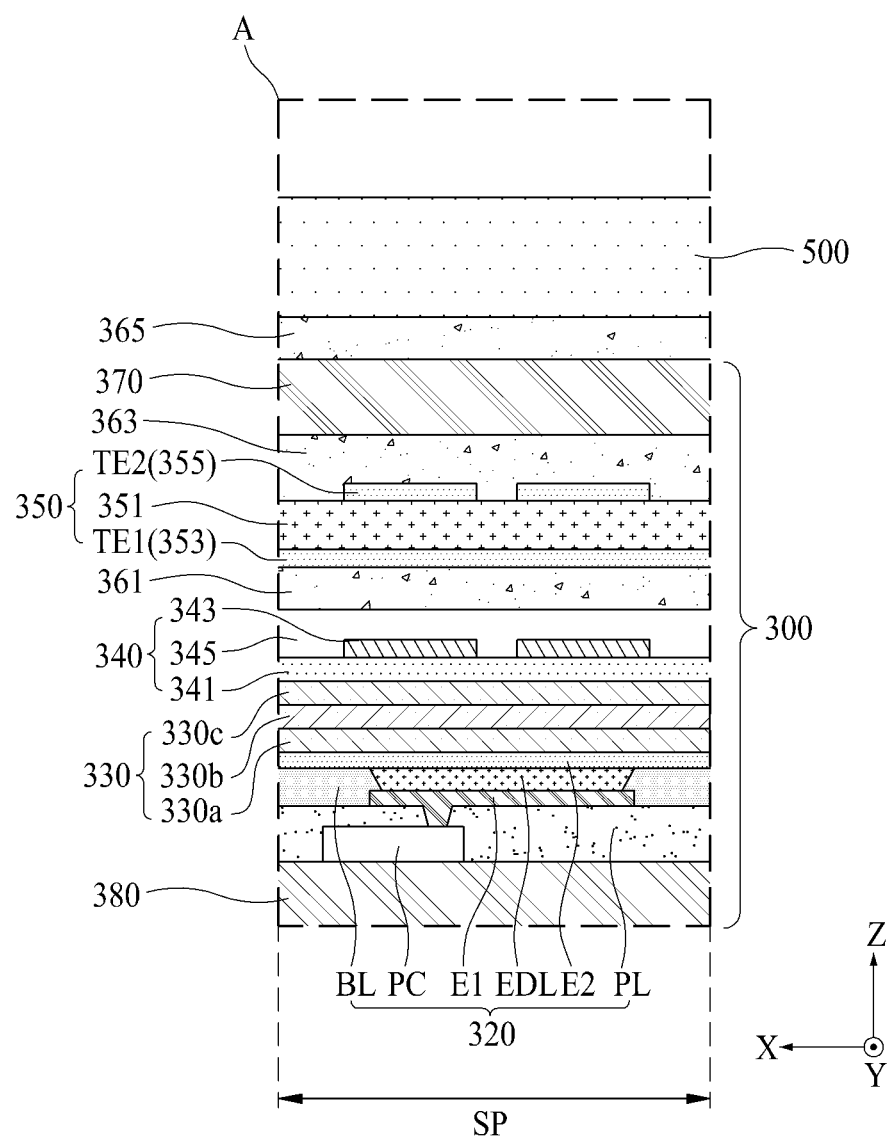
FIG. 3 is an expanded view of portion "A" shown in FIG. 2.

FIG. 1 is a perspective view illustrating an electronic device according to one embodiment of the present disclosure, FIG. 2 is a cross sectional view along I-I' line of FIG. 1, and FIG. 3 is an expanded view of portion "A" shown in FIG. 2.

Referring to FIGS. 1 to 3, the electronic device can include a housing 100, a display module 300, a cover window 500, and a driving circuit 700.

The housing 100 receives the display module 300 therein, and supports the cover window 500. That is, the housing 100 covers each lateral surface of the display module 300 and the cover window 500.

The housing 100 according to one embodiment of the present disclosure can have a receiving space defined by a housing plate 110 and a housing sidewall 130, in which the housing 100 can be formed in a case shape whose front surface is opened. The housing 100 can include a metal material or a plastic material. For example, the housing 100 can include an aluminum (Al) material, an invar material, or a magnesium (Mg) material.

The housing plate 110, which corresponds to a bottom surface of the receiving space, supports the display module 300, and covers a rear surface of the display module 300.

A rear surface of the housing plate 110 is used as a system receiving space 110s. The system receiving space 110s can receive the driving circuit 700, a battery for supplying a driving power, a communication module, a power circuit, a security module, a speaker module, a camera module, and a memory. The system receiving space 110s is covered by the rear cover 150. For a replacement of the battery, the rear cover 150 can be detachably connected with a rear surface of the housing 100, but not limited to this structure. If the electronic device uses an embedded battery, the rear cover 150 and the housing 100 are formed as one body.

The housing sidewall 130 is vertically prepared at each lateral side of the housing plate 110. The housing sidewall 130 supports the cover window 500, and covers each lateral surface of the display module 300 and each lateral surface of the cover window 500.

Selectively, with respect to a height direction (Z, vertical axis direction), the housing sidewall 130 includes a groove 131 prepared in its upper inner surface. Herein, an elastic member 170 is provided in the groove 131 of the housing sidewall 130. Since the elastic member 170 is attached to the groove 131 and provided between a rear edge portion of the cover window 700 and the housing sidewall 130, to thereby absorb an external impact applied to the cover window 700, and also to make the cover window 700 bend smoothly by a user's force touch. The elastic member 170 according to one embodiment of the present disclosure can include an elastic pad with an elastic restoring force, a double-sided attaching foam pad, or a spring.

The display module 300 according to one embodiment of the present disclosure displays an image corresponding to a data signal provided from the driving circuit 700, and also serves as a touch panel of that senses a touch position and/or a touch force level in accordance with a user's touch on a touch screen of the cover window 700. The display module 300 can include a substrate 310, a pixel array layer 320, an encapsulation layer 330, a shielding layer 340, and a touch sensing layer 350.

The substrate 310 is a base substrate, in which the substrate 310 includes a plastic material or a glass material. If the substrate 310 includes the plastic material, the substrate 310 can include an opaque material or a polyimide material. For example, in situation of the substrate 310 including the polyimide material, it is obtained by coating polyimide resin at a constant thickness on a front surface of a release layer prepared on a relatively thick carrier substrate, and curing the coated polyimide resin. In this instance, the carrier glass substrate is separated from the substrate 310 by a release of the release layer with a laser release process.

Additionally, if the substrate 310 includes the plastic material, the display module 300 according to the embodiment of the present disclosure can further include a back plate 380 connected with a lower surface of the substrate 310 with respect to a thickness direction (Z, vertical axis direction). The back plate 380 is provided to maintain a plane state of the substrate 310. The back plate 380 can include a plastic material, for example, polyethyleneterephthalate material. The back plate 380 is laminated on the lower surface of the substrate 310 separated from the carrier glass substrate, to thereby maintain the plane state of the substrate 310.

The pixel array layer 320 is prepared on the substrate 310, in which the pixel array layer 320 includes a plurality of pixels (SP).

Each of the plurality of pixels (SP) is prepared in each pixel region is defined by a plurality of gate lines, a plurality of data lines, and a plurality of pixel driving power lines. Each of the plurality of pixels (SP) corresponds to a minimum unit of emitting virtual light, which can be defined by a sub pixel. At least three adjoining pixels (SP) can constitute a unit pixel for displaying a color image. For example, the unit pixel can include adjoining red, green, and blue pixels. In order to improve a luminance, the unit pixel can further include a white pixel.

Each of the plurality of pixels (SP) according to one embodiment of the present disclosure can include a pixel circuit (PC), a planarization layer (PL), a first electrode (E1), a bank layer (BL), an emission device layer (EDL), and a second electrode (E2).

The pixel circuit (PC) is prepared in a circuit region defined in the pixel (SP), and is connected with the adjoining gate line, data line, and pixel driving power line. In response to a scan pulse from the gate line based on pixel driving power supplied from the pixel driving power line, the pixel circuit (PC) controls a current flowing in the emission device layer (EDL) in accordance with a data signal supplied from the data line. The pixel circuit (PC) can include a switching thin film transistor, a driving thin film transistor, and a storage capacitor.

The thin film transistor can include a gate electrode, a gate insulating film, a semiconductor layer, a source electrode, and a drain electrode, which are prepared on the substrate 310. In this instance, the thin film transistor can be a-Si TFT, poly-Si TFT, oxide TFT, or organic TFT. Also, the thin film transistor can have an upper gate structure, a lower gate structure, or a double gate structure having lower and upper gates.

The switching thin film transistor can include a gate electrode connected with the gate line, a source electrode connected with the data line, and a drain electrode connected with the gate electrode of the driving thin film transistor. The source and drain electrodes of the switching thin film transistor can be reversed according to a current direction. The switching thin film transistor is switched-on by the scan pulse supplied to the gate line, and the switched-on switching thin film transistor supplies the data signal, which is supplied to the data line, to the driving thin film transistor.

The driving thin film transistor is turned-on by a voltage supplied from the switching thin film transistor and/or a capacitor voltage, and the turned-on driving thin film transistor controls an amount of current flowing from the pixel driving power line to the emission device layer (EDL). Thus, the driving thin film transistor according to one embodiment of the present disclosure can include a gate electrode connected with the drain electrode of the switching thin film transistor, a drain electrode connected with the pixel driving power line, and a source electrode connected with the emission device layer (EDL), that is, first electrode (E1). The driving thin film transistor controls the data current flowing from the pixel driving power line to the emission device layer (EDL) based on the data signal supplied from the switching thin film transistor, to thereby make the emission device layer (EDL) emit light whose luminance is proportional to the data signal.

The storage capacitor is prepared in an overlapping area between the gate and source electrodes of the driving thin film transistor. The storage capacitor stores a voltage corresponding to the data signal supplied from the gate electrode of the driving thin film transistor, and turns-on the driving thin film transistor by the use of stored voltage.

Additionally, the display module 300 according to the embodiment of the present disclosure can further include a scan driving circuit prepared in a non-display area of the substrate 310. The scan driving circuit generates the scan pulse in accordance with a scan control signal supplied from the driving circuit 700, and supplies the generated scan pulse to the corresponding gate line according to a preset order. The scan driving circuit according to one embodiment of the present disclosure is prepared at a predetermined portion capable of supplying the scan pulse to the gate line in the non-display area of the substrate 310.

The planarization layer (PL) is prepared on the substrate 310, in which the planarization layer (PL) covers the pixel circuit (PC). The planarization layer (PL) provides a plane surface on the substrate 310 with the thin film transistor.

The first electrode (E1) corresponds to an anode electrode. The first electrode (E1) is patterned on the planarization layer (PL) overlapped with an opening area defined in each pixel region. The first electrode (E1) is electrically connected with the source electrode of the driving thin film transistor prepared in the pixel circuit (PC) via a contact hole prepared in the planarization layer (PL), whereby the first electrode (E1) receives the data current provided from the driving thin film transistor. The first electrode (E1) can be formed of a metal material with high reflectance, for example, aurums (Au), argentums (Ag), aluminum (Al), molybdenum (Mo), magnesium (Mg), or their alloys, but not limited to these materials.

The bank layer (BL), covers an edge portion of the first electrode (E1) and the pixel circuit (PC), is prepared on the planarization layer (PL), to thereby define the opening area of each pixel region. The bank layer (BL) can include an organic material, for example, benzocyclobutadiene, acryl, or polyimide. Additionally, the bank layer (BL) can be formed of photoresist containing black pigment. In this instance, the bank layer (BL) functions as a light shielding member (or black matrix).

The emission device layer (EDL) is prepared on the first electrode (E1) of the opening area defined by the bank layer (BL). That is, the emission device layer (EDL) includes an emission layer interposed between the first electrode (E1) and the second electrode (E2), in which the emission device layer (EDL) can be an organic light emitting device.

The emission device layer (EDL) can include a hole injecting layer, a hole transporting layer, an organic emitting layer, an electron transporting layer, and an electron injecting layer which are sequentially deposited on the first electrode (E1) with respect to a thickness direction (Z). In this instance, it is possible to omit one layer or two layers among the hole injecting layer, the hole transporting layer, the electron transporting layer, and the electron injecting layer. Also, the emission device layer (EDL) can further include at least one function layer of controlling the electron and/or hole injected into the organic emitting layer.

The organic emitting layer according to one embodiment of the present disclosure can be prepared to emit different-colored light by each pixel, for example, red light, green light, or blue light.

The second electrode (E2), which covers the emission device layer (EDL) and the bank layer (BL), is prepared on the substrate 310, and the second electrode (E2) is connected with the emission device layer (EDL) of each pixel (SP) in common. The second electrode (E2) can be defined as a cathode electrode or a common electrode in accordance with a direction of the current flowing in the emission device layer (EDL). The second electrode (E2) receives a cathode power supplied from the driving circuit 700. In this instance, the cathode power can be a ground voltage or a D.C. voltage having a predetermined level.

The second electrode (E2) can be formed of a transparent metal material with high transmittance. For example, the second electrode (E2) can include a transparent conductive material such as TCO (transparent conductive oxide), for example, ITO (indium tin oxide), IZO (indium zinc oxide), IZTO (indium zinc tin oxide), ICO (indium cesium oxide), or IWO (indium tungsten oxide). In order to minimize a damage of the emission device layer (EDL) by a processing temperature for manufacturing the second electrode (E2), selectively, the second electrode (E2) can be formed of an amorphous conductive material by a low-temperature metal deposition process with a processing temperature below 100° C. That is, if the second electrode (E2) is formed of a crystalline transparent conductive material, the emission device layer (EDL) is damaged by a high-temperature heat treatment process which is performed so as to secure a low resistance value in the second electrode (E2). Preferably, the second electrode (E2) is formed of the amorphous conductive material by the low-temperature metal deposition process.

The encapsulation layer 330 is provided to cover the pixel array layer 320, to thereby prevent moisture permeation into each pixel (SP), and furthermore, to protect the emission device layer (EDL) which is vulnerable to an external moisture or oxygen. That is, the encapsulation layer 330 is prepared on the substrate 310 to cover the second electrode (E2). The encapsulation layer 330 according to one embodiment of the present disclosure can be formed in a single-layered structure of an inorganic layer or an organic layer, or can be formed in a double-layered structure of alternately-deposited inorganic and organic layers.

The encapsulation layer 330 can include a first inorganic layer 330a prepared on the substrate 310 so as to cover the second electrode (E2), an organic layer 330b covering the first inorganic layer 330a, and a second inorganic layer 330c covering the organic layer 330b.

The first inorganic layer 330a is disposed adjacent to the emission device layer (EDL). The first inorganic layer 330a is formed of an inorganic insulating material which is deposited at a low temperature, for example, silicon nitride (SiNx), silicon oxide (SiOx), silicon oxinitride (SiOn), or aluminum oxide (AlxOy). In this instance, since the emission device layer (EDL) is vulnerable to a high temperature, the first inorganic layer 330a is manufactured in a low-temperature atmosphere, for example, by a low-temperature process below 100° C. Thus, it is possible to prevent the emission device layer (EDL) from being damaged by a high-temperature atmosphere applied to a process chamber for a process of manufacturing the first inorganic layer 330a.

The organic layer 330b is prepared on the substrate 310 so as to cover the entire surface of the first inorganic layer 330a. The organic layer 330b absorbs a stress between each of layers when the display module 300 is curved, and also enhances a planarization function. The organic layer 330b according to one embodiment of the present disclosure can include an organic insulating material, for example, benzocyclobutadiene, acryl, or polyimide.

The second inorganic layer 330c is provided on the substrate 310, in which the second inorganic layer 330c covers the entire surface of the organic layer 330b, and also covers each lateral surface of the first inorganic layer 330a. The second inorganic layer 330c firstly prevents moisture or oxygen from being permeated into the organic layer 330b and the first inorganic layer 330a. The second inorganic layer 330c can be formed of an inorganic insulating material which is capable of being deposited at a low temperature, for example, silicon nitride (SiNx), silicon oxide (SiOx), silicon oxinitride (SiOn), or aluminum oxide (AlxOy), or can be formed of the same material as that of the first inorganic material 330a.

The substrate 310, the pixel array layer 320, and the encapsulation layer 330 constitutes a display panel, and more particularly, to an organic light emitting display panel.

The shielding layer 340 is prepared on the display panel, that is, on the encapsulation layer 330. Since the shielding layer 340 is electrically floating or electrically grounded, it is possible to prevent deterioration of picture quality and/or touch sensitivity caused by display noise and touch noise occurring in the display panel. The shielding layer 340 can include a transparent conductive layer 341, and a metal pattern layer 343.

The transparent conductive layer 341 can be formed of a transparent conductive material such as TCO (transparent conductive oxide) which is directly deposited on an upper surface of the encapsulation layer 330. In this instance, the transparent conductive layer 341 can be a shielding electrode which is formed as one body on the entire upper surface of the encapsulation layer 330. For example, the transparent conductive layer 341 can include a transparent conductive material, for example, ITO (indium tin oxide), IZO (indium zinc oxide), IZTO (indium zinc tin oxide), ICO (indium cesium oxide), or IWO (indium tungsten oxide). Since the transparent conductive layer 341 is electrically floating or electrically grounded, it is possible to prevent deterioration of picture quality and/or touch sensitivity caused by display noise and touch noise occurring in the display panel.

In order to minimize a damage of the emission device layer (EDL) by a processing temperature for manufacturing the transparent conductive layer 341, selectively, the transparent conductive layer 341 can be formed of an amorphous conductive material by a low-temperature metal deposition process with a processing temperature below 100° C. That is, if the transparent conductive layer 341 is formed of a crystalline transparent conductive material, the emission device layer (EDL) can be damaged by a high-temperature heat treatment process which is performed so as to secure a low resistance value in the transparent conductive layer 341. Accordingly, the transparent conductive layer 341 is formed of the amorphous conductive material by the low-temperature metal deposition process so that it is possible to prevent the emission device layer (EDL) from being damaged for the process of manufacturing the transparent conductive layer 341.

Figure 4:
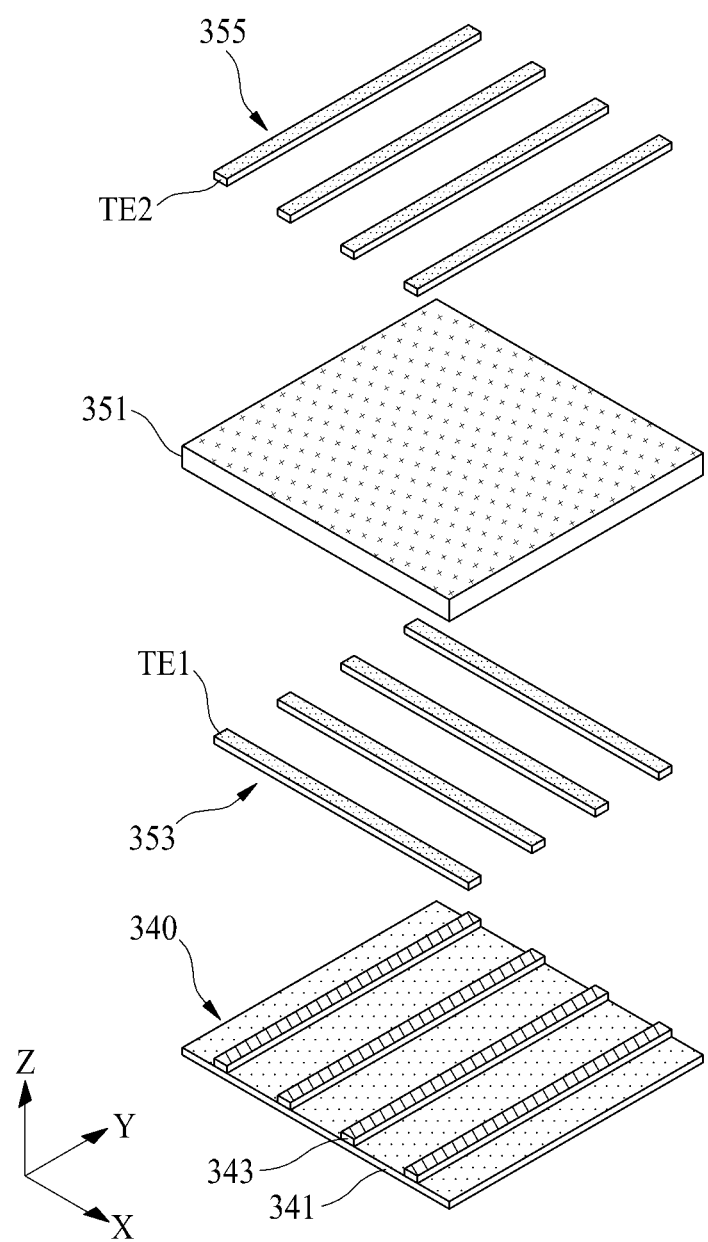
FIG. 4 is a perspective view illustrating a touch sensing layer and a shielding layer shown in FIG. 2.

The metal pattern layer 343 is deposited on an upper surface of the transparent conductive layer 341, in which the metal pattern layer 343 lowers a surface resistance of the transparent conductive layer 341. The metal pattern layer 343 according to one embodiment of the present disclosure can be formed in a single-layered structure or double-layered structure of low-resistance metal materials, for example, Al, Ti, Cu, Mo, Ag, Mg, Ag:Mg, Ni, Cu, CNT, Au, Ta, and W, or their alloys. As shown in FIG. 4, the metal pattern layer 343 can include a plurality of line patterns.

The plurality of line patterns can have line shapes which are provided at fixed intervals along a first horizontal axis direction (X) which is parallel to a first length direction of the substrate 310, and are extending to have a constant width and thickness along a second horizontal axis direction (Y) which is parallel to a second length direction of the substrate 310. In this instance, the first horizontal axis direction (X) of the substrate 310 can be a direction parallel to a short side direction of the substrate 310, and the second horizontal axis direction (Y) of the substrate 310 can be a direction parallel to a long side direction of the substrate 310. In the same manner as the transparent conductive layer 341, the plurality of line patterns can be formed of an amorphous metal material by a low-temperature metal deposition process with a processing temperature below 100° C., to thereby minimize a damage of the emission device layer (EDL). For example, each of the plurality of line patterns can be formed in a single-layered structure of any one material among Al, Ti, Cu, Mo, Ag, Mg, Ag:Mg, Ni, Cu, CNT, Au, Ta, and W, or can be formed in a three-layered structure of Ti/Al/Ti or Mo/Al/Mo.

Selectively, the shielding layer 340 can further include an insulating layer 345 provided on the encapsulation layer 330 so as to cover the metal pattern layer 343 and the transparent conductive layer 341. The insulating layer 345 is provided to electrically insulate the metal pattern layer 343 and the transparent conductive layer 341 from each other. The insulating layer 345 can include an inorganic insulating material or organic insulating material which is capable of being deposited at a low temperature. In this instance, the inorganic insulating material can be formed of silicon nitride (SiNx), silicon oxide (SiOx), silicon oxinitride (SiOn), or aluminum oxide (AlxOy), but not limited to these materials. The organic insulating material can be formed of benzocyclobutadiene, acryl, or polyimide, but not limited to these materials.

Referring once again to FIGS. 1 to 4, the touch sensing layer 350 is prepared on the shielding layer 340. The touch sensing layer 350 serves as a touch screen or a touch sensor for sequentially sensing a touch position and a touch force level in accordance with a touch of a touch input object on the cover window 500. In this instance, the touch input object can be a user's body including a finger or a touch pen.

The touch sensing layer 350 according to one embodiment of the present disclosure is attached to an upper surface of the shielding layer 340 by the use of first transparent adhesive member 361. That is, the touch sensing layer 350 can be attached to the shielding layer 340, that is, an upper surface of the insulating layer 345 by the use of first transparent adhesive member 361. If the first transparent adhesive member 361 has the electrical insulating properties, it is possible to omit the insulating layer 345 from the shielding layer 340. In this instance, the first transparent adhesive member 361 is attached to an upper surface of the transparent conductive layer 341 so as to cover the metal pattern layer 343. The first transparent adhesive member 361 can include OCA (optical clear adhesive) or OCR (optical clear resin).

The touch sensing layer 350 according to one embodiment of the present disclosure includes a pressure response member 351, a first touch electrode layer 353, and a second touch electrode layer 355.

The pressure response member 351 is overlapped with the encapsulation layer 330, and the pressure response member 351 supports the first touch electrode layer 353 and the second touch electrode layer 355. Since the electrical properties of the pressure response member 351 change in accordance with the touch of the touch input object, the pressure response member 351 functions as a pressure response sensor for sensing a touch force of the touch input object.

The pressure response member 351 can include a transparent piezoelectric material having a piezoelectric effect. In this instance, the piezoelectric effect indicates an occurrence of a potential difference resulting from a dielectric polarization in accordance with a relative position change of positive (+) ion and negative (−) ion when a crystalline structure is pressed or twisted by an applied force.

The piezoelectric material can include any one among PVDF (polyvinylidene difluoride), PZT (Lead Zirconate Titanate), PLLA (Poly-L-Lactide), Nylon, and Parylene-C, but not limited to these materials. The piezoelectric material can be formed of any transparent material having the piezoelectric effect. For example, among the above piezoelectric materials, PVDF is a semicrystalline ferroelectric polymer, which has advantages of high elastic constant, good flexibility, easy film-manufacturing process, lightness, improved flexibility and durability (which is very flexible without being broken), and durability against impact. Preferably, the pressure response member 351 includes PVDF.

The first touch electrode layer 353 includes at least one of first touch electrode (TE1) prepared on a first surface (or rear surface) of the pressure response member 351 confronting/facing the shielding layer 340. The first touch electrode layer 353 according to one embodiment of the present disclosure includes a plurality of first touch electrodes (TE1). In this instance, the plurality of first touch electrodes (TE1) can have line shapes which are provided at fixed intervals along the second horizontal axis direction (Y) and are extending to have constant width and thickness along the first horizontal axis direction (X). The first touch electrode (TE1) serves as a touch driving electrode (or touch sensing electrode) for the touch sensing.

The second touch electrode layer 355 includes at least one of second touch electrode (TE2) prepared on a second surface (or front surface) of the pressure response member 351 facing the cover window 700. The second touch electrode layer 355 according to one embodiment of the present disclosure includes a plurality of second touch electrodes (TE2). In this instance, the plurality of second touch electrodes (TE2) can have line shapes which are provided at fixed intervals along the first horizontal axis direction (X) and are extending to have constant width and thickness along the second horizontal axis direction (Y). That is, the plurality of second touch electrodes (TE2) are parallel to the plurality of line patterns prepared in the shielding layer 340. The second touch electrode (TE2) serves as a touch sensing electrode (or touch driving electrode) for the touch sensing.

The plurality of second touch electrodes (TE2) can be overlapped with the plurality of line patterns, or may not be overlapped with the plurality of line patterns. In this instance, if the plurality of second touch electrodes (TE2) according to one embodiment of the present disclosure are overlapped with the plurality of line patterns, it is possible to effectively prevent the touch noise, which might occur by the plurality of second touch electrodes (TE2), by the plurality of line patterns in the shielding layer 340. If the plurality of second touch electrodes (TE2) according to one embodiment of the present disclosure are not overlapped with the plurality of line patterns, it is possible to uniformly transmit light in the shielding layer 340 and the touch sensing layer 350.

Figure 5A:
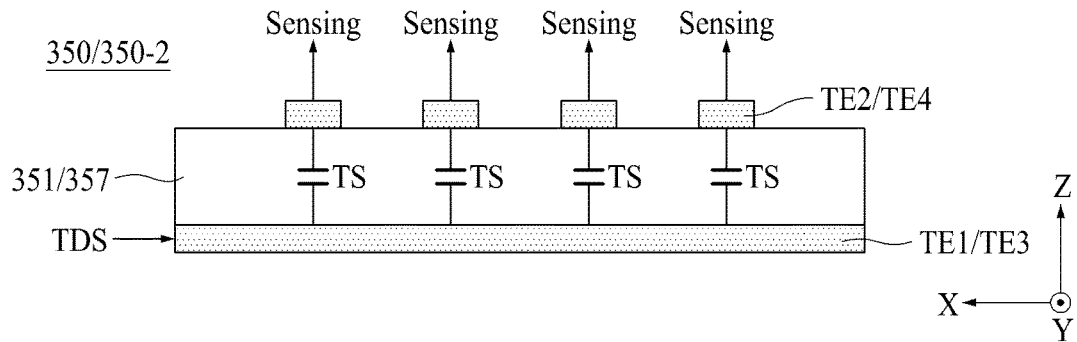
FIGS. 5A and 5B are cross sectional views illustrating a method of driving a touch sensing layer according to one embodiment of the present disclosure.
Figure 5B:
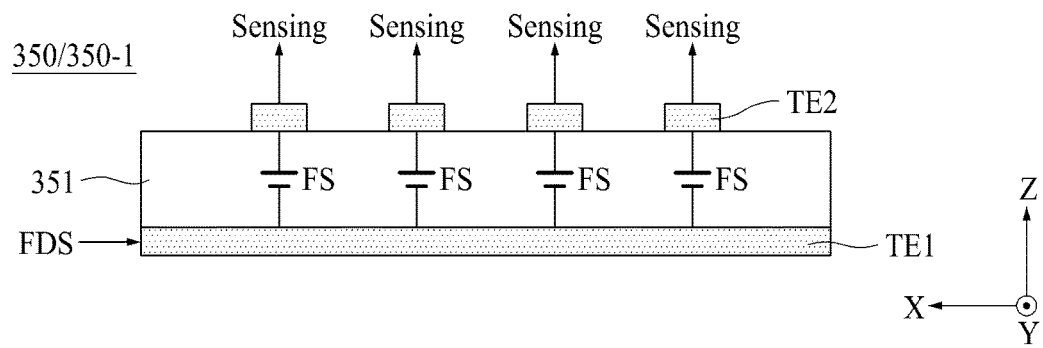

Since the pressure response member 351 is interposed between the first touch electrode layer 353 and the second touch electrode layer 355, it is possible to form a touch sensor (TS) between the first touch electrode (TE1) and the second touch electrode (TE2) as shown in FIG. 5A, or to form a force sensor (FS) between the first touch electrode (TE1) and the second touch electrode (TE2) as shown in FIG. 5B.

The touch sensor (TS) can be defined by a capacitance formed in the pressure response member 351 between the first touch electrode (TE1) and the second touch electrode (TE2). In case of the capacitance of the touch sensor (TS), electric charges are charged in accordance with a touch driving signal (TDS) applied to the touch driving electrode, and the charge amount is changed in accordance to the touch of the touch input object. Accordingly, the touch position can be sensed by a touch position calculating algorithm modeling a reduction of the charge amount of the capacitance formed in the touch sensor (TS) in accordance with the touch of the touch input object. In this instance, the touch driving signal (TDS) can be a pulse width modulation signal including at least two driving pulses.

The force sensor (FS) according to one embodiment of the present disclosure can be a piezoelectric sensor prepared in the pressure response member 351 between the first touch electrode (TE1) and the second touch electrode (TE2). In this instance, if the pressure response member 351 includes the piezoelectric material, the force sensor (FS) serves as a piezoelectric sensor whose output voltage is changed in accordance with an applied touch force (or touch pressure). The voltage of the force sensor (FS) is changed by the piezoelectric effect in accordance with deformation of the pressure response member 351 by the touch force of the touch input object based on force driving voltage (FDV) applied to the touch driving electrode. The voltage of the force sensor (FS) is increased in accordance with the increase of the pressure based on the touch force of the touch input object. Thus, the touch force level can be sensed by a touch force level calculating algorithm of modeling the increase of voltage in the force sensor (FS) in accordance with the touch force of the touch input object. In this instance, the force driving voltage (FDV) can be a D.C. voltage signal having a ground voltage level or a constant voltage level.

Referring once again to FIGS. 1 to 3, the display module 300 according to one embodiment of the present disclosure can further include a polarizing layer 370.

The polarizing layer 370 is prepared on the touch sensing layer 350, in which the polarizing layer 370 polarizes light which advances from each pixel (SP) to the cover window 700. The polarizing layer 370 can be a polarizing film which is attached to an upper surface of the touch sensing layer 350 by the use of second transparent adhesive member 363. For example, the polarizing layer 370 can be a circularly polarizing film including a circular polarizer. In this instance, the polarizing layer 370 prevents a reflection of external light by a metal layer prepared in each of the pixel array layer 320 and the touch sensing layer 350. The second transparent adhesive member 363 can include OCA (optical clear adhesive) or OCR (optical clear resin).

Selectively, the display module 300 can further include a barrier film interposed between the encapsulation layer 330 and the touch sensing layer 350.

The barrier film can be obtained by coating an inorganic insulating film onto an organic insulating film. The barrier film is provided to firstly prevent external moisture or oxygen from being permeated into each pixel (SP), in which the barrier film can be formed of a material with low moisture permeability. Since the barrier film serves as a supporter for supporting a lower surface (or rear surface) of the touch sensing layer 350, the touch force based on the touch of the touch input object is applied to the pressure response member 351. Also, the barrier layer absorbs the impact applied to the pixel array layer 320 in accordance with the touch force of the touch input object, to thereby prevent the emission device layer (EDL) from being damaged by the impact.

The cover window 500 is disposed on a front surface of the display module 300, and is supported by the housing 100. In this instance, the cover window 500 is supported by the housing 100, and its shape can change. That is, the cover window 500 supported by the housing 100 becomes concave toward the housing plate 110 of the housing 100 when the touch of the touch input object is applied thereto.

The cover window 500 according to one embodiment of the present disclosure is attached to the front surface of the display module 300 by the use of third transparent adhesive member 365, and more particularly, to a front surface of the polarizing layer 370, to thereby support the display module 300, and protect the display module 300 from the external impact. The third transparent adhesive member 365 can be OCA (optical clear adhesive) or OCR (optical clear resin).

The cover window 500 can be formed of tempered glass, transparent plastic, or a transparent film. In consideration of scratch or transparency, preferably, the cover window 500 according to one embodiment of the present disclosure includes the tempered glass. For example, the cover window 500 can include at least one of sapphire glass and Gorilla Glass.

Selectively, the cover window 500 is not attached to the display module 300, but provided at a predetermined interval from the display module 300 so as to cover an entire surface of the display module 300, to thereby protect the display module 300 from the external impact. Accordingly, an air gap is prepared between the cover window 500 and the display module 300. In this instance, if the cover window 500 is damaged by the external impact, it is possible to minimize a damage of the display module 300.

The driving circuit 700 displays an image on the display module 300, calculates the touch position coordinates and/or touch force level by sensing the touch position and the touch force in accordance with the touch of the touch input object through the display module 300, and executes an application program or an application function corresponding to the calculated touch position coordinates and/or touch force level.

The driving circuit 700 can include a circuit board 710, a first flexible printed circuit cable 720, a second flexible printed circuit cable 730, a display driving circuit 740, a touch driving circuit 750, a touch control circuit 760, and a system controller 770.

The circuit board 710 is received in the system receiving space 110s of the housing 110, and the circuit board 710 supports the touch control circuit 760 and the system controller 770.

The first flexible printed circuit cable 720 is connected with a first connector prepared in the circuit board 710, and is connected with a display pad portion 110a prepared in the substrate 310 of the display module 300.

The second flexible printed circuit cable 730 is connected with a second connector prepared in the circuit board 710, and is connected with first and second touch pad portions 350a and 350b prepared in the touch sensing layer 350 of the display module 300. The second flexible printed circuit board 730 according to one embodiment of the present disclosure can include a first touch electrode connecting portion connected with the plurality of first touch electrodes (TE1) prepared in the touch sensing layer 350, and a second touch electrode connecting portion connected with the plurality of second touch electrodes (TE2).

The display driving circuit 740 is provided to display an image in each pixel (SP) of the display module 300, in which the display driving circuit 740 can be a driving integrated circuit mounted on a chip-mounting area of the substrate 310 by a chip-on-glass method. The display driving circuit 740 is connected with the display pad portion 110a prepared at a first edge of the substrate 310, connected with the plurality of data lines by a one-to-one correspondence, and connected with a scan driving circuit. The display driving circuit 740 receives digital video data, a timing synchronization signal, driving power, and cathode power from the system controller 770 through the first flexible printed circuit cable 720 and the display pad portion 110a. For example, the display driving circuit 740 generates pixel data for each pixel by aligning the digital video data according to an arrangement structure in the plurality of pixels (SP), converts the pixel data into the data signal for each pixel, supplies the data signal to the corresponding pixel through the corresponding data line, and supplies the cathode power to the second electrode (E2) connected with each pixel (SP) in common. At the same time, the display driving circuit 740 generates a scan control signal in accordance with the timing synchronization signal, and provides the generated scan control signal to the scan driving circuit.

Selectively, the display driving circuit 740 can be mounted on the first flexible printed circuit cable 720. In this instance, the display driving circuit 740 receives digital the video data, timing synchronization signal, driving power, and cathode power from the system controller 770 through the first flexible printed circuit cable 720, supplies the data signal for each pixel to the corresponding data line through the display pad portion 110a, supplies the cathode power to the second electrode (E2), and supplies the scan control signal to the scan driving circuit.

The touch driving circuit 750 is mounted on the second flexible printed circuit cable 730. The touch driving circuit 750 is connected with the touch control circuit 760 mounted on the circuit board 710 through the second flexible printed circuit cable 730, connected with the plurality of first touch electrodes (TE1) through the first touch pad portion 350a by a one-to-one correspondence, and connected with the plurality of second touch electrodes (TE2) through the second touch pad portion 350b by a one-to-one correspondence.

In response to the touch synchronization signal supplied from the touch control circuit 760, the touch driving circuit 750 according to one embodiment of the present disclosure drives the touch sensing layer 350 of the display module 300 by a time-division method including a first touch sensing period and a second touch sensing period. In this instance, the first touch sensing period can be defined as a touch position sensing period for sensing a touch event and touch position of the touch input object, and a second touch sensing period can be defined as the touch force sensing period for sensing a touch force of the touch input object. For example, the first touch sensing period can be the period corresponding to a first logic state of the touch synchronization signal, and the second touch sensing period can be the period corresponding to a second logic state of the touch synchronization signal.

For the first touch sensing period, as shown in FIG. 5A, the touch driving circuit 750 applies the touch driving signal (TDS) to at least one among the plurality of touch driving electrodes, and senses the change of capacitance in the touch sensor (TS), which is formed in the pressure response member 351 of the touch sensing layer 350 in accordance with the touch of the touch input object, through the plurality of touch sensing electrodes, to thereby generate the touch sensing data. For example, for the first touch sensing period, the touch driving circuit 750 sequentially applies the touch driving signal (TDS) to the plurality of first touch electrodes (TE1), and senses the change of capacitance in the touch sensor (TS) through the plurality of second touch electrodes (TE2), to thereby generate the touch sensing data.

For the second touch sensing period, as shown in FIG. 5B, the touch driving circuit 750 applies the force driving voltage (FDV) to at least one among the plurality of touch driving electrodes, and senses the change of voltage in the force sensor (FS), which is formed in the pressure response member 351 of the touch sensing layer 350 in accordance with the touch force of the touch input object, through the plurality of touch sensing electrodes, to thereby generate the force sensing data. For example, for the second touch sensing period, the touch driving circuit 750 sequentially applies the force driving voltage (FDV) to the plurality of first touch electrodes (TE1), and senses the change of voltage in the force sensor (FS) through the plurality of second touch electrodes (TE2), to thereby generate the force sensing data.

In order to shorten the second touch sensing period and/or reduce power consumption of the second touch sensing period, selectively, the touch driving circuit 750 senses the touch force only for a touch event area of the first touch sensing period. That is, the touch driving circuit 750 firstly performs the touch position sensing by a global touch sensing or group touch sensing under the control of the touch control circuit 760, and secondly performs the touch force sensing only for the touch event area by a local force touch sensing under the control of the touch control circuit 760. For example, the touch driving circuit 750 applies the force driving voltage (FDV) to at least on touch driving electrode included in the touch event area for the second touch sensing period, and senses the voltage change of the force sensor (FS) formed in the pressure response member 351 of the touch sensing layer 350 through at least one touch sensing electrode included in the touch event area in accordance with the force touch of the touch input object, to thereby generate the force sensing data. In this instance, the touch force sensing is locally executed for the touch event area sensed for the first touch sensing period so that it is possible to shorten the second touch sensing period and to reduce the power consumption of the second touch sensing period.

Additionally, the touch driving circuit 750 according to one embodiment of the present disclosure is electrically connected with the shielding layer 340 through a connection terminal 340a, whereby the shielding layer 340 is electrically floating or electrically grounded. For example, the touch driving circuit 750 is electrically connected with the shielding layer 340 through the connection terminal 340a and the second flexible printed circuit cable 730 or additionally-provided third flexible printed circuit cable, whereby the transparent conductive layer 341 of the shielding layer 340 is electrically floating or electrically grounded.

Selectively, the shielding layer 340 can be electrically grounded. In this instance, the shielding layer 340 is not connected with the touch driving circuit 750. Instead, the shielding layer 340 can be electrically connected with the housing 100 of the metal material through an additional ground strap electrically connected with the connection terminal 340a.

The touch control circuit 760 is mounted on the circuit board 710, and is connected with the touch driving circuit 750 through the second flexible printed circuit cable 730.

The touch control circuit 760 according to one embodiment of the present disclosure generates the touch synchronization signal, and controls driving of the touch driving circuit 750. The touch control circuit 760 according to one embodiment of the present disclosure generates the touch synchronization signal having the first touch sensing period and the second touch sensing period, and controls the time-division driving of the touch driving circuit 750. The touch control circuit 760 generates the touch position coordinates (or 2D touch information) based on the touch sensing data provided from the touch driving circuit 750, generates the touch force level (or 3D touch information) based on the force sensing data, and provides the generated touch position coordinates and touch force level to the system controller 770.

The touch control circuit 760 according to one embodiment of the present disclosure calculates the touch position coordinates in accordance with the position of the touch sensing electrode and the touch driving electrode corresponding to a maximum value of the touch sensing data above a touch threshold value of the touch sensing data, temporarily stores the touch position coordinates in the memory, calculates the touch force level corresponding to a maximum value of the force sensing data above a force threshold value of the force sensing data, and temporarily stores the touch force level in the memory. Then, the touch control circuit 760 provides touch information including the touch position coordinates and the touch force level temporarily stored in the memory to the system controller 770.

Selectively, the touch control circuit 760 according to one embodiment of the present disclosure checks whether or not there is the touch event based on the touch coordinates information temporarily stored in the memory, calculates the touch event area based on the check result, and controls the touch driving circuit 750 in a local force touch sensing mode based on the touch event area. Accordingly, the touch driving circuit 750 applies the force driving voltage (FDV) to at least one touch driving electrode included in the touch event area in accordance with the local force touch sensing mode, generates the force sensing data by sensing the voltage change of the force sensor (FS), formed in the pressure response member 351 in accordance with the force touch of the touch input object, through at least one touch sensing electrode included in the touch event area, and provides the force sensing data to the touch control circuit 760.

Selectively, the touch control circuit 760 and the touch driving circuit 750 can be formed of one touch integrated circuit. In this instance, the touch integrated circuit can be mounted on the second flexible printed circuit cable 430 or the circuit board 710. Furthermore, the touch control circuit 760 can be provided inside the system controller 770.

The system controller 770 corresponding to a MCU (micro controller unit) is mounted on the circuit board 710, to thereby control an entire operation of the electronic device. That is, the system controller 770 generates the timing synchronization signal and data signal to be displayed on the display module 300 in accordance with a source image supplied from a video processing module, and provides the generated timing synchronization signal and data signal to the display driving circuit 740. Also, the system controller 770 executes the 2D touch information and/or 3D touch information supplied from the touch control circuit 760, e.g., an application program corresponding to a program shortcut icon or an application program function. In this instance, the application program can be the application program based on the touch position or touch force of the electronic device.

In case of the electronic device according to the embodiment of the present disclosure, the touch sensing layer 350 is disposed in the display module 300 so that it is possible to sense the touch position and the touch force, and also to realize a thin profile of the electronic device. Also, the electronic device according to the embodiment of the present disclosure is provided with the shielding layer 340 interposed between the touch sensing layer 350 and the pixel array layer 320 so that it is possible to prevent deterioration of picture quality and/or touch sensitivity caused by the display noise and touch noise occurring in the display panel. In the electronic device according to the embodiment of the present disclosure, the touch sensing layer 350, which includes the first touch electrode (TE1) and the second touch electrode (TE2), and the pressure response member 351 interposed between the first touch electrode (TE1) and the second touch electrode (TE2), is driven in the time-division method so that it is possible to sense the touch position and the touch force level through the use of touch sensing layer 350.

Figure 6:
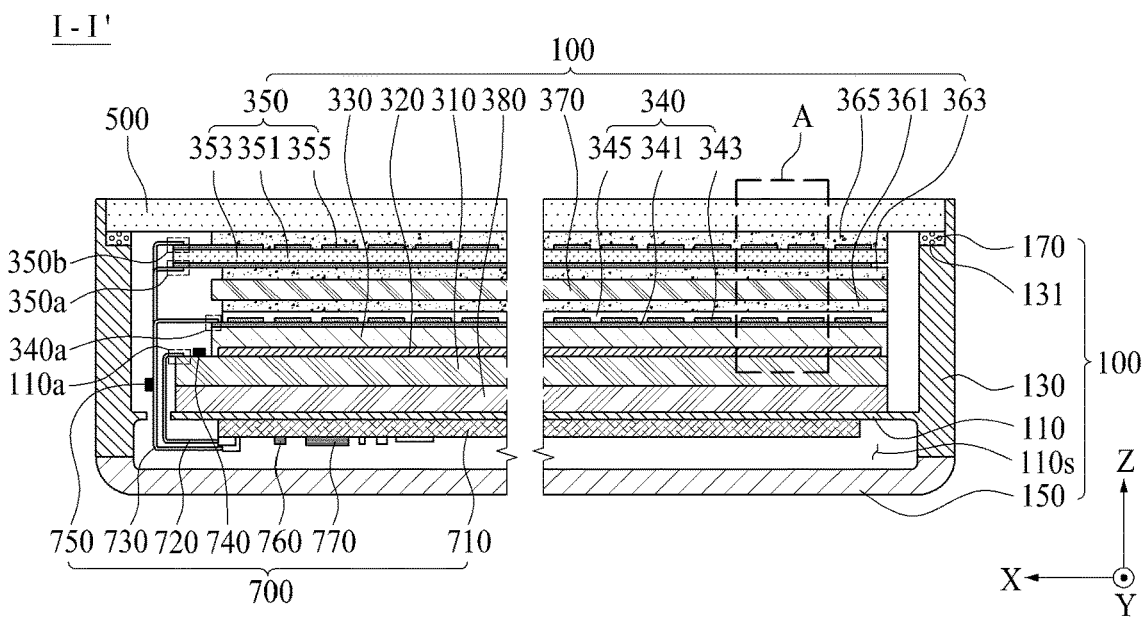
FIG. 6 is a cross sectional view along I-I' line of FIG. 1 according to an embodiment of the present disclosure.

FIG. 6 is a cross sectional view along I-I' line of FIG. 1, which is obtained by changing the structure of the display module. Hereinafter, only the structure of the display module will be described in detail as follows.

Referring to FIG. 6, the display module 300 can include the pixel array layer 320, the encapsulation layer 330, the shielding layer 340, the first transparent adhesive member 361, the polarizing layer 370, the second transparent adhesive member 363, and the touch sensing layer 350. Except for the location of the polarizing layer 370, the display module 300 of FIG. 6 is identical to the display module shown in FIGS. 2 and 3, whereby a detailed description for the same parts will be omitted.

The polarizing layer 370 according to one embodiment of the present disclosure is interposed between the shielding layer 340 and the touch sensing layer 350. That is, a first surface of the polarizing layer 370 is attached to the shielding layer 340 by the use of first transparent adhesive member 361, and a second surface of the polarizing layer 370 is attached to a lower surface of the touch sensing layer 350 by the use of second transparent adhesive member 363.

The touch sensing layer 350 can directly confront/face a lower surface of the cover window 500, or can be attached to the lower surface of the cover window 500 by the use of third transparent adhesive member 365.

The touch sensing layer 350 is disposed adjacent to the cover window 500, that is, a touch surface of the touch input object, to thereby improve the touch sensitivity. Also, the polarizing layer 370 disposed below the touch sensing layer 350 is used as a supporter of the touch sensing layer 350 so that it is possible to improve a response speed in the pressure response member 351 of the touch sensing layer 350 in accordance with the touch force of the touch input object.

Figure 7A:
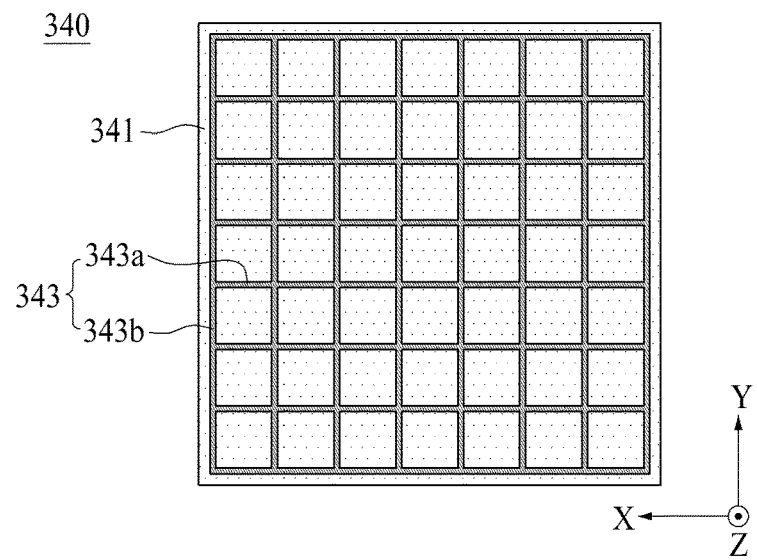
FIGS. 7A and 7B are plane views illustrating a metal pattern layer of a shielding layer shown in FIG. 2 or 6 according to embodiments of the present disclosure.
Figure 7B:
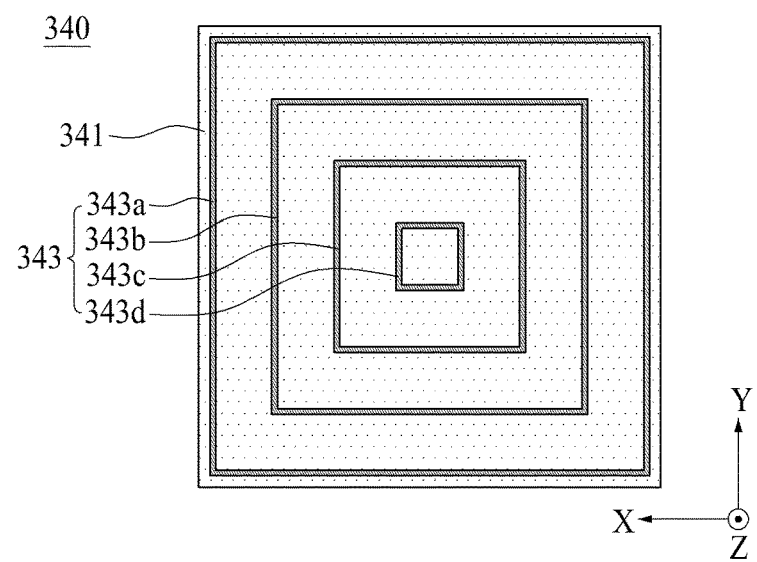

FIGS. 7A and 7B are plane views illustrating the metal pattern layer of the shielding layer shown in FIG. 2 or 6.

Referring to FIG. 7A, the metal pattern layer 343 of the shielding layer 340 can include a plurality of first pattern lines 343a and a plurality of second pattern lines 343b which are perpendicular to each other on an upper surface of the transparent conductive layer 341.

The plurality of first pattern lines 343a are extending to have a constant width and thickness along the first horizontal axis direction (X), are provided at fixed intervals along the second horizontal axis direction (Y), and are prepared on the upper surface of the transparent conductive layer 341.

The plurality of second pattern lines 343b are extending to have a constant width and thickness along the second horizontal axis direction (Y), are provided at fixed intervals along the first horizontal axis direction (X), and are prepared on the upper surface of the transparent conductive layer 341.

The metal pattern layer 343 of the shielding layer 340 according to one embodiment of the present disclosure has a mesh shape by the plurality of first and second pattern lines which are perpendicular to each other on the upper surface of the transparent conductive layer 341, that is, the same plane surface.

Referring to FIG. 7B, the metal pattern layer 343 of the shielding layer 340 according to one embodiment of the present disclosure can include a plurality of closed loop patterns 343a to 343d on the upper surface of the transparent conductive layer 341.

Each of the plurality of closed loop patterns 343a to 343d is prepared in a closed loop shape to have a constant width and thickness. In this instance, the plurality of closed loop patterns 343a to 343d are provided in such a way that a length of a side in each of the plurality of closed loop patterns 343a to 343d is gradually decreased from the periphery of the transparent conductive layer 341 to the center of the transparent conductive layer 341. That is, the plurality of closed loop patterns 343a to 343d can have concentric rectangular shapes.

Since the metal pattern layer 343 of the shielding layer 340 according to one embodiment of the present disclosure, which can have the mesh shape or can have the plurality of closed loop shapes, is directly prepared on the upper surface of the transparent conductive layer 341, it is possible to reduce a surface resistance of the transparent conductive layer 341.

Figure 8:
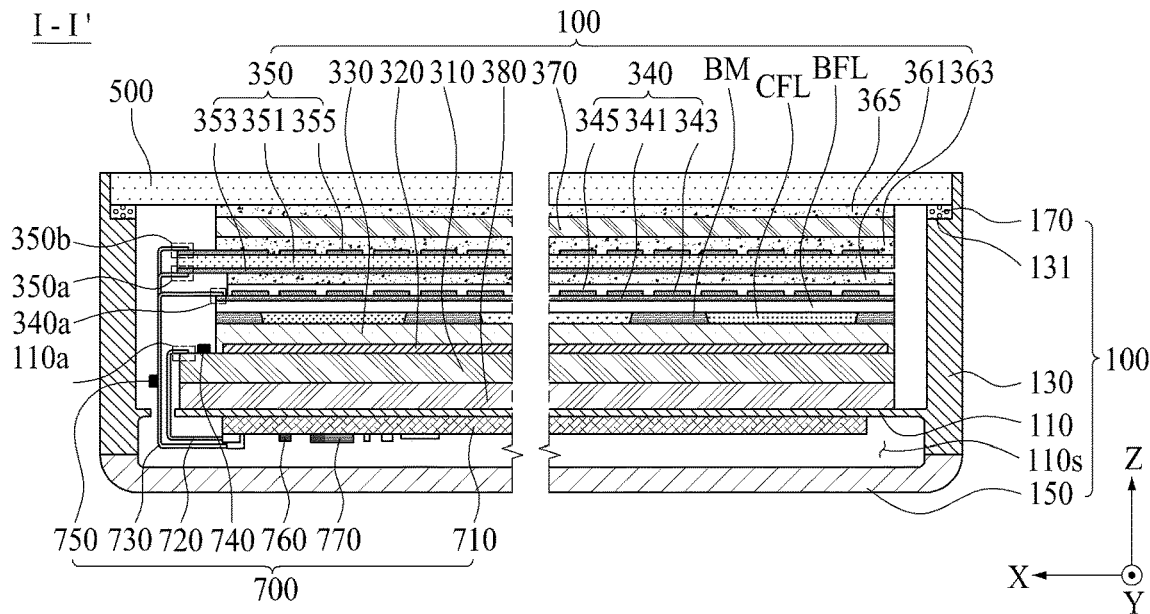
FIG. 8 is a cross sectional view along I-I' line of FIG. 1 according to an embodiment of the present disclosure.

FIG. 8 is a cross sectional view along I-I' line of FIG. 1, which is obtained by additionally providing a black matrix, a color filter layer, and a buffer layer to the display module of the electronic device shown in FIG. 1. Hereinafter, only the additional structures of the display module will be described In more detail, and a detailed description for the same parts will be omitted.

Except for that an emission device layer prepared in each pixel emits white light, the pixel array layer 320 of the display module 300 shown in FIG. 8 is the same as the aforementioned display module, whereby a detailed description for the same parts will be omitted.

The emission device layer for emitting white light includes at least two organic emitting layers. The emission device layer according to one embodiment of the present disclosure can have a 2-stack structure including a blue organic emitting layer and a yellow-green organic emitting layer. The emission device layer according to another embodiment of the present disclosure can have a 3-stack structure including a first blue organic emitting layer, a yellow-green organic emitting layer, and a second blue organic emitting layer. The emission device layer having the 2-stack structure can include the organic light emitting device disclosed in the Korean Patent Application No. 10-2013-0070771, or 10-2014-0055968. The emission device layer having the 3-stack structure can include the organic light emitting device disclosed in the Korean Patent Application No. 10-2015-0113308, 10-2015-0025727, or 10-2015-0015647.

The black matrix (BM) and the color filter layer (CFL) are directly prepared on the upper surface of the encapsulation layer 330.

The black matrix (BM) defines the opening area of each pixel prepared in the substrate 310. That is, the black matrix (BM) is directly provided on the encapsulation layer 330 which is overlapped with the remaining areas except the opening area overlapped with the emission device layer of each pixel so that it is possible to prevent color mixing of the adjoining opening areas. The black matrix (BM) according to one embodiment of the present disclosure can include a plurality of first light shielding patterns covering the plurality of gate lines and the pixel circuit of each pixel, a plurality of second light shielding patterns covering the plurality of data lines and the plurality of pixel driving power lines, and a third light shielding pattern covering the border of the encapsulation layer 330.

The color filter layer (CFL) is directly provided on the upper surface of the encapsulation layer 330 which is overlapped with the opening area defined by the black matrix (BM). The color filter layer (CFL) can include red, green, and blue color filters corresponding to the colors defined in the respective pixels. The color filter layer (CFL) transmits only light having a wavelength of a color for the corresponding pixel in the white light emitted from the pixel.

The buffer layer (BFL) is prepared to cover the black matrix (BM) and the color filter layer (CFL). The buffer layer (BFL) provides a flat surface on the black matrix (BM) and the color filter layer (CFL). Also, the buffer layer (BFL) supports the shielding layer 340, and protects the color filter layer (CFL) from a manufacturing process of the shielding layer 340.

The buffer layer (BFL) prevents external moisture or liquid chemical (developing solution or etching solution) used for the manufacturing process of the shielding layer 340 from being permeated into the emission device layer, and furthermore, prevents the emission device layer from being damaged by the external moisture or liquid chemical. Preferably, in order to prevent the emission device layer which is vulnerable to a high temperature from being damaged, the buffer layer (BFL) is manufactured at a low temperature below 100° C., and is formed of an organic insulating material having a low dielectric constant of 1~3. For example, the buffer layer (BFL) can be formed of an acryl-based material, an epoxy-based material, or a siloxane-based material.

The shielding layer 340, the touch sensing layer 350, and the polarizing layer 370 are sequentially prepared on the buffer layer (BFL). Except for the shielding layer 340, the touch sensing layer 350, and the polarizing layer 370 being sequentially prepared on the upper surface of the buffer layer (BFL), the display module in FIG. 8 is the same as the display module shown in FIGS. 1 to 5, whereby a detailed description for the same parts will be omitted.

Selectively, the shielding layer 340, the polarizing layer 370, and the touch sensing layer 350 can be sequentially prepared on the buffer layer (BFL). Except that the shielding layer 340, the polarizing layer 370, and the touch sensing layer 350 are sequentially prepared on the buffer layer (BFL), this display module is the same as the display module shown in 6, whereby a detailed description for the same parts will be omitted.

The electronic device according to the embodiment of the present disclosure provides the same effect as that of the electronic device shown in FIGS. 1 to 7B, and the emission device layers of the respective pixels have the same structure, whereby it is possible to simplify the manufacturing process of the emission device layer and to prevent the emission device layer from being damaged by using the buffer layer (BFL) for protection during the manufacturing process of the shielding layer 340.

Figure 9:
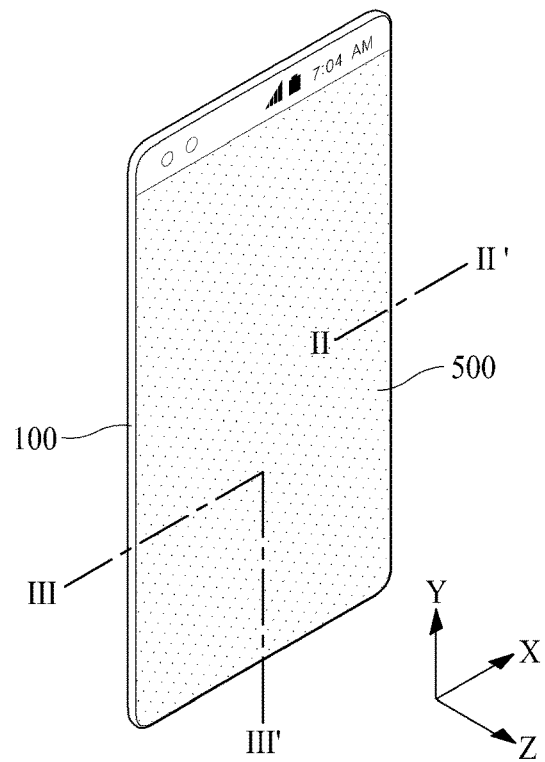
FIG. 9 is a perspective view illustrating an electronic device according to another embodiment of the present disclosure.
Figure 10:
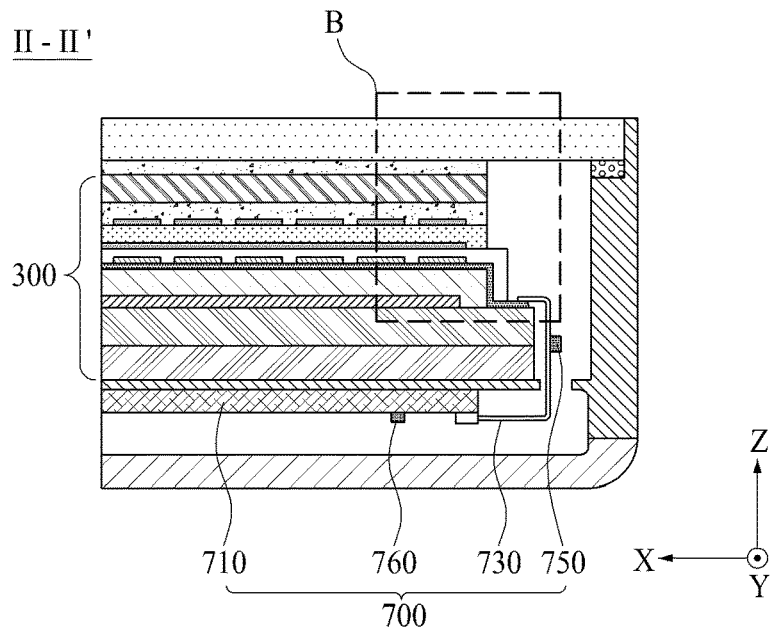
FIG. 10 is a cross sectional view along II-II' line of FIG. 9.
Figure 11:
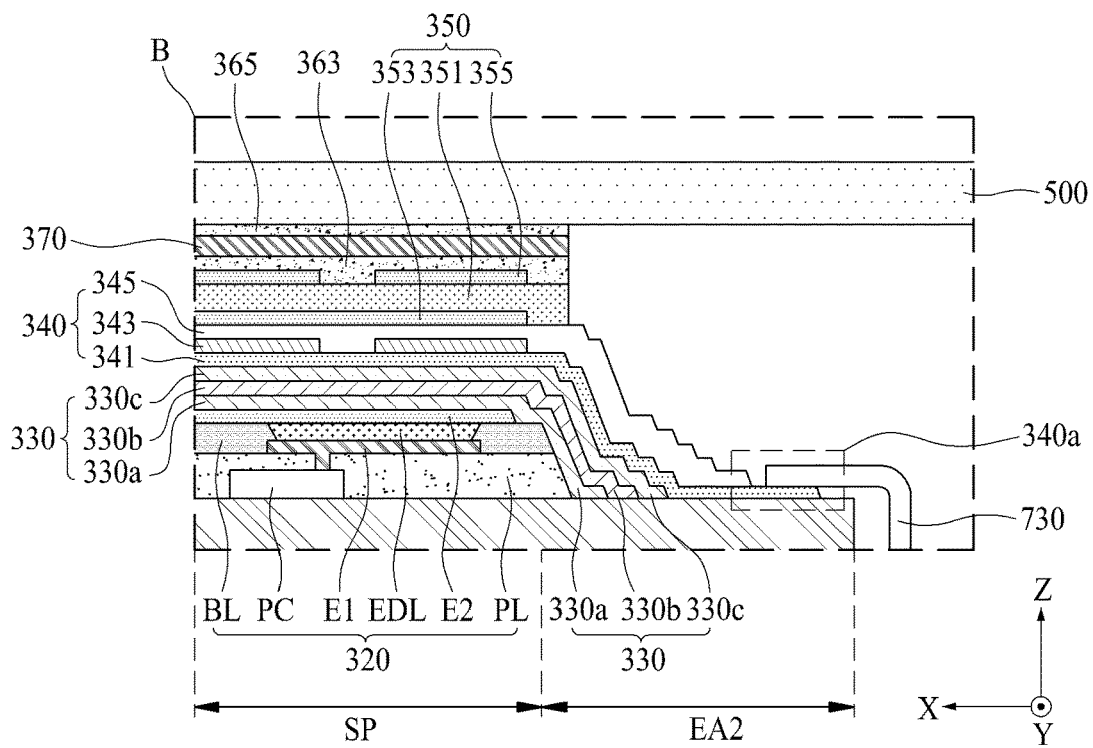
FIG. 11 is an expanded view illustrating portion "B" shown in FIG. 9.
Figure 12:
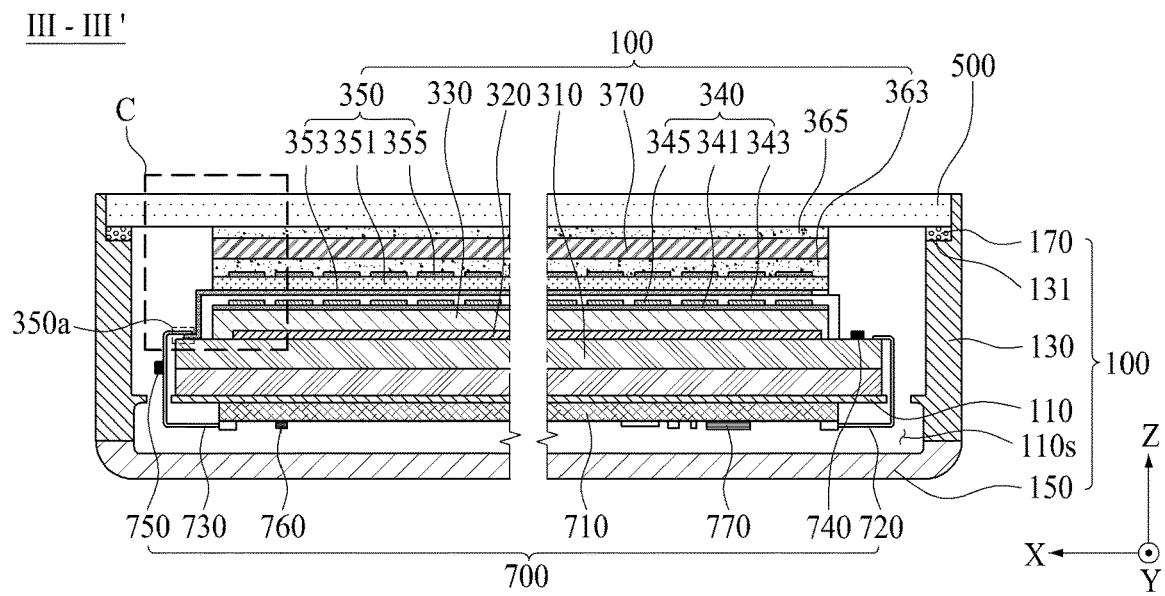
FIG. 12 is a cross sectional view along III-III' line of FIG. 9.
Figure 13:
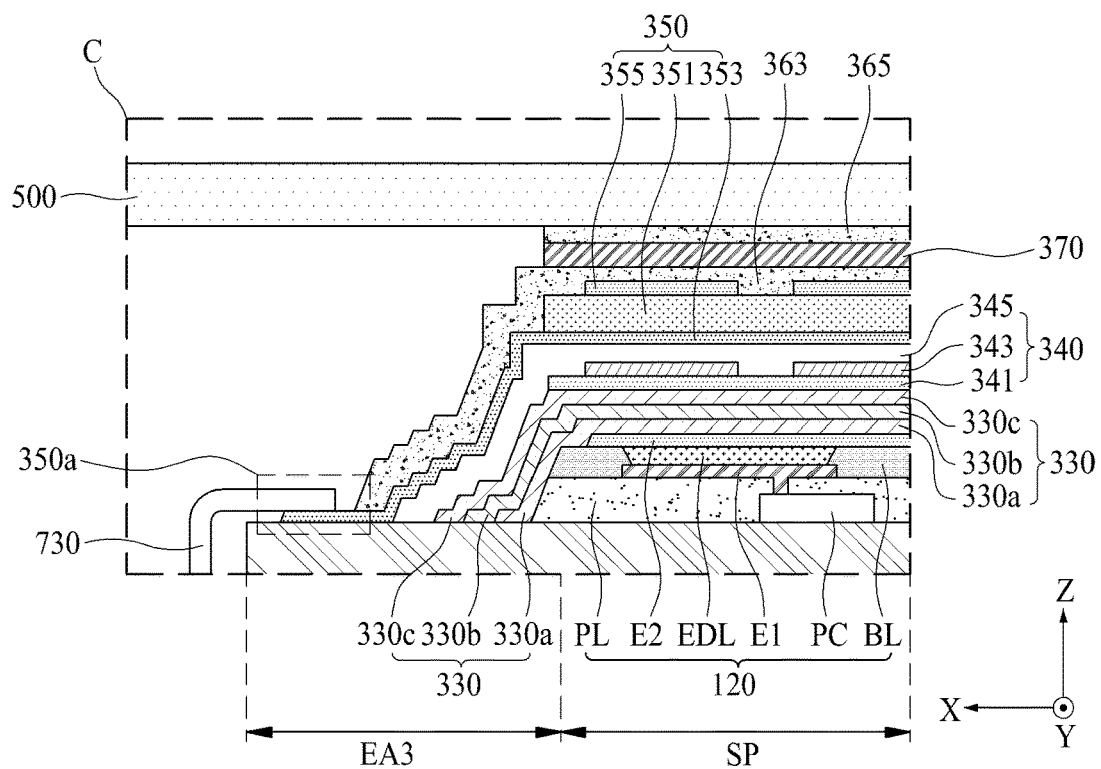
FIG. 13 is an expanded view illustrating portion "C" shown in FIG. 12.

FIG. 9 is a perspective view illustrating an electronic device according to another embodiment of the present disclosure, FIG. 10 is a cross sectional view along II-II' line of FIG. 9, FIG. 11 is an expanded view illustrating portion "B" of FIG. 9, FIG. 12 is a cross sectional view along line of FIG. 9, and FIG. 13 is an expanded view illustrating portion "C" of FIG. 12, which is obtained by a changing a structure of a display module in the electronic device shown in FIGS. 1 to 8 in accordance with a changed manufacturing process. Hereinafter, only the display module will be described In more detail, and a detailed description for the remaining elements except for the display module will be omitted.

Referring to FIGS. 9 to 13, the display module 300 according to another embodiment of the present disclosure can include a substrate 310, a pixel array layer 320, an encapsulation layer 330, a shielding layer 340, a touch sensing layer 350, and a polarizing layer 370.

The pixel array layer 320 and the encapsulation layer 330 are the same as those of the aforementioned embodiment, whereby a detailed description for the pixel array layer 320 and the encapsulation layer 330 will be omitted.

The shielding layer 340 is directly deposited on an upper surface of the encapsulation layer 330. Since the shielding layer 340 is electrically floating or electrically grounded, it is possible to prevent deterioration of picture quality and/or touch sensitivity caused by display noise and touch noise occurring in the display panel. The shielding layer 340 according to one embodiment of the present disclosure can include a transparent conductive layer 341, a metal pattern layer 343, an insulating layer 345, and a connection terminal 340a.

The transparent conductive layer 341 is directly deposited on the upper surface of the encapsulation layer 330. In this instance, the transparent conductive layer 341 is formed of a transparent conductive material such as TCO (transparent conductive oxide). The transparent conductive layer 341 is formed as one body on the entire upper surface of the encapsulation layer 330. In the same manner as the aforementioned embodiment, the transparent conductive layer 341 can be formed of an amorphous conductive material.

The metal pattern layer 343 is directly deposited on an upper surface of the transparent conductive layer 341, to thereby reduce a surface resistance of the transparent conductive layer 341. The metal pattern layer 343 can include a plurality of line patterns shown in FIG. 4, a mesh pattern shown in FIG. 7A, or a plurality of closed loop patterns 343a to 343d shown in FIG. 7B.

The insulating layer 345 is provided to electrically insulate the metal pattern layer 343 and the transparent conductive layer 341 from each other. The insulating layer 345 can include an organic insulating material or inorganic insulating material capable of being deposited at a low temperature. The insulating layer 345 is prepared to cover each lateral surface of the metal pattern layer 345, the transparent conductive layer 341, and the encapsulation layer 330.

The connection terminal 340a can include at least one connection pad prepared at a second side (EA2) of the substrate 310. At least one connection pad is electrically connected with at least one extending line which extends to a first non-display area (IA1) of the substrate 310 along a lateral surface of the insulating layer 345 from a first side of the transparent conductive layer 341. The connection terminal 340a according to one embodiment of the present disclosure is connected with a touch driving circuit 750 through a second flexible printed circuit cable 730, and the connection terminal 340a is electrically floating or electrically grounded by the touch driving circuit 750. The connection terminal 340a according to another embodiment of the present disclosure is connected with an additional ground strap, and is then electrically connected with a housing 100 of a metal material through the ground strap, whereby the connection terminal 340a can be electrically grounded.

At least one extending line is covered by the insulating layer 345, and is insulated electrically by the insulating layer 345.

The touch sensing layer 350, which is directly provided on an upper surface of the shielding layer 340, serves as a touch screen or a touch sensor for sensing a touch position and a touch force level in accordance with a touch of a touch input object on a cover window 500. In this instance, the touch input object can be a user's body including a finger, or a touch pen.

The touch sensing layer 350 according to one embodiment of the present disclosure can include a first touch electrode layer 353, a pressure response member 351, a second touch electrode layer 355, a first touch pad portion 350a, and a second touch pad portion 350b.

The first touch electrode layer 353 is directly deposited on the shielding layer 340, that is, an upper surface of the insulating layer 345. That is, the first touch electrode layer 353 is directly provided on the upper surface of the insulating layer 345 by a metal deposition process without using an additional first transparent adhesive member. The first touch electrode layer 353 according to one embodiment of the present disclosure can include a plurality of first touch electrodes (TE1), as shown in FIG. 4. In this instance, the plurality of first touch electrodes (TE1) can have line shapes which are provided at fixed intervals along the second horizontal axis direction (Y) and are extending to have constant width and thickness along the first horizontal axis direction (X). The first touch electrode (TE1) serves as a touch driving electrode (or touch sensing electrode) for the touch sensing.

The pressure response member 351, which is prepared on the encapsulation layer 330, covers the first touch electrode layer 353. That is, the pressure response member 351 is directly provided on the encapsulation layer 330 provided with the first touch electrode layer 353, to thereby cover the first touch electrode layer 353. Since the electrical properties of the pressure response member 351 change in accordance with the touch of the touch input object, the pressure response member 351 functions as a pressure response sensor for sensing a touch force of the touch input object.

The pressure response member 351 according to one embodiment of the present disclosure can be provided at a constant thickness on the encapsulation layer 330 so as to cover the first touch electrode layer 353 by a coating and curing process using a solution of a piezoelectric material having a piezoelectric effect. Except for the pressure response member 351 being directly provided on the encapsulation layer 330 so as to cover the first touch electrode layer 353, the pressure response member 351 is formed of the same material as that of the aforementioned embodiment.

The second touch electrode layer 355 is directly deposited on an upper surface of the pressure response member 351. That is, the second touch electrode layer 355 is directly provided on the upper surface of the pressure response member 351 by a metal deposition process. The second touch electrode layer 355 can include a plurality of second touch electrodes (TE2), as shown in FIG. 4. In this instance, the plurality of second touch electrodes (TE2) can have line shapes which are provided at fixed intervals along the first horizontal axis direction (X) and are extending to have constant width and thickness along the second horizontal axis direction (Y). The second touch electrode (TE2) serves as a touch sensing electrode (or touch driving electrode) for the touch sensing.

The first touch pad portion 350a includes a plurality of first touch pad electrodes prepared at a third side (EA3) of the substrate 310. The plurality of first touch pad electrodes are connected with the plurality of first touch electrodes (TE1) through a plurality of first touch routing lines by a one-to-one correspondence. In addition, the third side (EA3) of the substrate 310 can be defined as a non-display area of the substrate 310 while being parallel to a second side (EA2) of the substrate 310. For example, the third side (EA3) of the substrate 310 can be defined as the non-display area of the substrate while being adjacent to one long side of the substrate 310. The first touch pad portion 350a is connected with the touch driving circuit 750 through the second flexible printed circuit cable 730 or another first flexible printed circuit cable additionally provided for a touch.

The plurality of first touch routing lines are extending to the third side (EA3) of the substrate 310 along the lateral surface of the insulating layer 345 from one end of each of the plurality of first touch electrodes (TE1), and then connected with the plurality of first touch pad electrodes by a one-to-one correspondence.

The second touch pad portion 350b includes a plurality of second touch pad electrodes prepared at a fourth side (EA4) of the substrate 310. The plurality of second touch pad electrodes are connected with the plurality of second touch electrodes (TE2) through a plurality of second touch routing lines by a one-to-one correspondence. In addition, the fourth side (EA4) of the substrate 310 can be defined as a non-display area of the substrate 310 while being parallel to a first side (EA1) of the substrate 310. For example, the fourth side (EA4) of the substrate 310 can be defined as the non-display area of the substrate 310 while being adjacent to the other short side of the substrate 310. The second touch pad portion 350b is connected with the touch driving circuit 750 through the second flexible printed circuit cable 730 or another second flexible printed circuit cable additionally provided for a touch.

The plurality of second touch routing lines are extending to the fourth side (EA4) of the substrate 310 along the lateral surface of the insulating layer 345 from one end of each of the plurality of second touch electrodes (TE2), and then connected with the plurality of second touch pad electrodes by a one-to-one correspondence.

Selectively, the second touch pad portion 350b together with the connection terminal 340a of the shielding layer 340 can be prepared at the second side of the substrate 310.

The polarizing layer 370 is attached to an upper surface of the touch sensing layer 350 by the use of second transparent adhesive member 363. This is the same as the aforementioned embodiment, whereby a detailed description for the polarizing layer 370 will be omitted.

The second transparent adhesive member 363 covers the plurality of first touch routing lines and the plurality of second touch routing lines prepared at each lateral surface of the touch sensing layer 350 except for the first touch pad portion 350a and the second touch pad portion 350b (e.g., FIG. 12).

Selectively, the display module 300 according to the embodiment of the present disclosure can further include a barrier film interposed between the encapsulation layer 330 and the touch sensing layer 350. This barrier film is the same as the aforementioned embodiment, whereby a detailed description for the barrier film will be omitted.

Additionally, the display module 300 according to the embodiment of the present disclosure can further include a black matrix (BM), a color filter layer (CFL), and a buffer layer (BFL) shown in FIG. 8. In this instance, the shielding layer 340 is prepared on an upper surface of the buffer layer (BFL).

The black matrix (BM), the color filter layer (CFL), and the buffer layer (BFL) are the same as those of the aforementioned embodiment, whereby a detailed description for the black matrix (BM), the color filter layer (CFL), and the buffer layer (BFL) will be omitted. Except that an emission device layer prepared in each pixel of the pixel array layer 320 emits white light, the pixel array layer 320 is the same as that of the aforementioned embodiment, whereby a detailed description for the pixel array layer 320 will be omitted.

In the electronic device according to the embodiment of the present disclosure, the touch sensing layer 350 is directly provided on the upper surface of the shielding layer 340, and the touch sensing layer 350 generates 2D touch information and/or 3D touch information by sensing the touch of the touch input object, whereby it is possible to provide the same effect as that of the electronic device shown in FIGS. 1 to 8, and to realize thinness and to simplify the manufacturing process owing to the touch sensing layer 350 being directly provided on the upper surface of the shielding layer 340.

Figure 14:
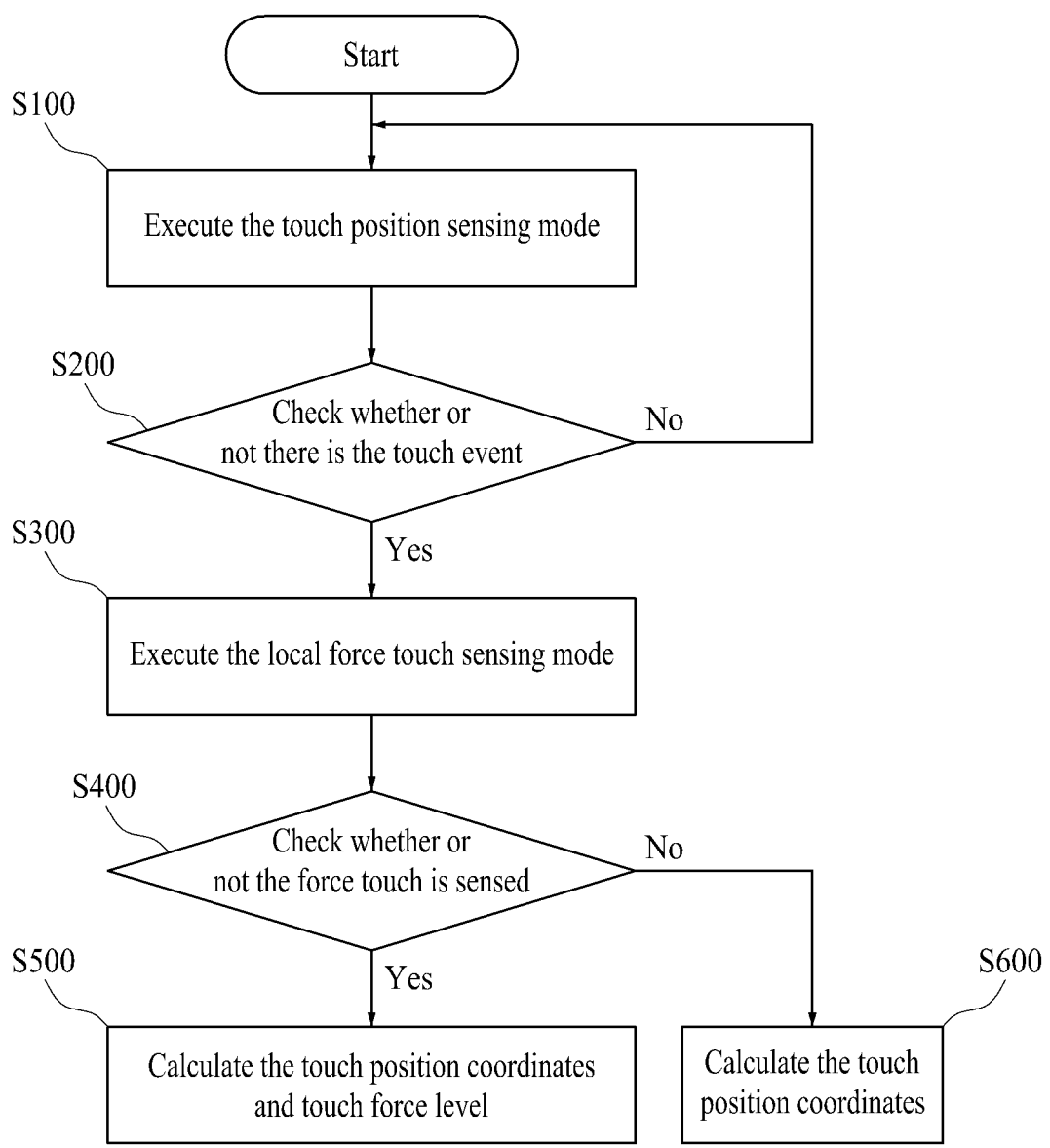
FIG. 14 is a flow chart illustrating a touch sensing method of the electronic device according to one embodiment of the present disclosure.

FIG. 14 is a flow chart illustrating a touch sensing method of the electronic device according to the embodiment of the present disclosure.

The touch sensing method of the electronic device will be described with reference to FIG. 14 in connection with FIGS. 1 to 13.

First, the shielding layer 340 prepared in the display module 300 is electrically floating by the touch driving circuit 750, or electrically grounded by the touch driving circuit 750 or the additional ground strap.

The touch driving circuit 750 according to one embodiment of the present disclosure executes the touch position sensing mode for the first touch sensing period (S100). That is, for the first touch sensing period, as shown in FIG. 5A, the touch driving circuit 750 applies the touch driving signal (TDS) to at least one among the plurality of touch driving electrodes, generates the touch sensing data by sensing the change of capacitance in the touch sensor (TS) formed in the pressure response member 351 between the first touch electrode (TE1) and the second touch electrode (TE2) through the plurality of touch sensing electrodes, and provides the generated touch sensing data to the touch control circuit 760.

Then, the touch control circuit 760 checks whether or not there is the touch event based on the touch sensing data for the first touch sensing period (S200).

In the step of S200, if there is no touch event ("No" of S200), the touch control circuit 760 controls the touch driving circuit 750 in the touch position sensing mode. Thus, the touch driving circuit 750 re-executes the touch position sensing mode under the control of the touch control circuit 760 (S100).

In the step of S200, if there is the touch event ("Yes" of S200), the touch control circuit 760 calculates the touch event area based on the touch sensing data, and controls the touch driving circuit 750 in the local force touch sensing mode. Thus, the touch driving circuit 750 executes the local force touch sensing mode for the second touch sensing period (S300). That is, for the second touch sensing period, as shown in FIG. 5B, the touch driving circuit 750 applies the force driving voltage (FDV) to at least one touch driving electrode included in the touch event area, generates the touch force data by sensing the voltage change of the force sensor (FS) formed in the pressure response member 550 between the first ouch electrode (TE1) and the second touch electrode (TE2) in accordance with the touch force of the touch input object, and provides the touch force data to the touch control circuit 760.

Then, the touch control circuit 760 checks whether or not the force touch is sensed based on the force sensing data for the second touch sensing period (S400).

In the step of S400, if the force touch is sensed in the touch event area ("Yes" of S400), the touch control circuit 760 calculates the touch force level based on the force sensing data and the touch position coordinates corresponding to the touch event area, and provides the touch force level to the system controller 770 (S500). Accordingly, the system controller 770 executes the application corresponding to the touch force level and the touch position coordinates provided from the touch control circuit 760.

In the step of S400, if the force touch is not sensed in the touch event area ("No" of S400), the touch control circuit 760 calculates the touch position coordinates corresponding to the touch event area, and provides the calculated touch position coordinates to the system controller 770 (S600). Accordingly, the system controller 770 executes the application corresponding to the touch position coordinates provided from the touch control circuit 760.

In the touch sensing method of the electronic device according to the embodiment of the present disclosure, the local force touch sensing mode is executed according to whether or not there is the touch even in the touch position sensing mode so that it is possible to shorten the second touch sensing period and/or to reduce the power consumption of the second touch sensing period.

Figure 15:
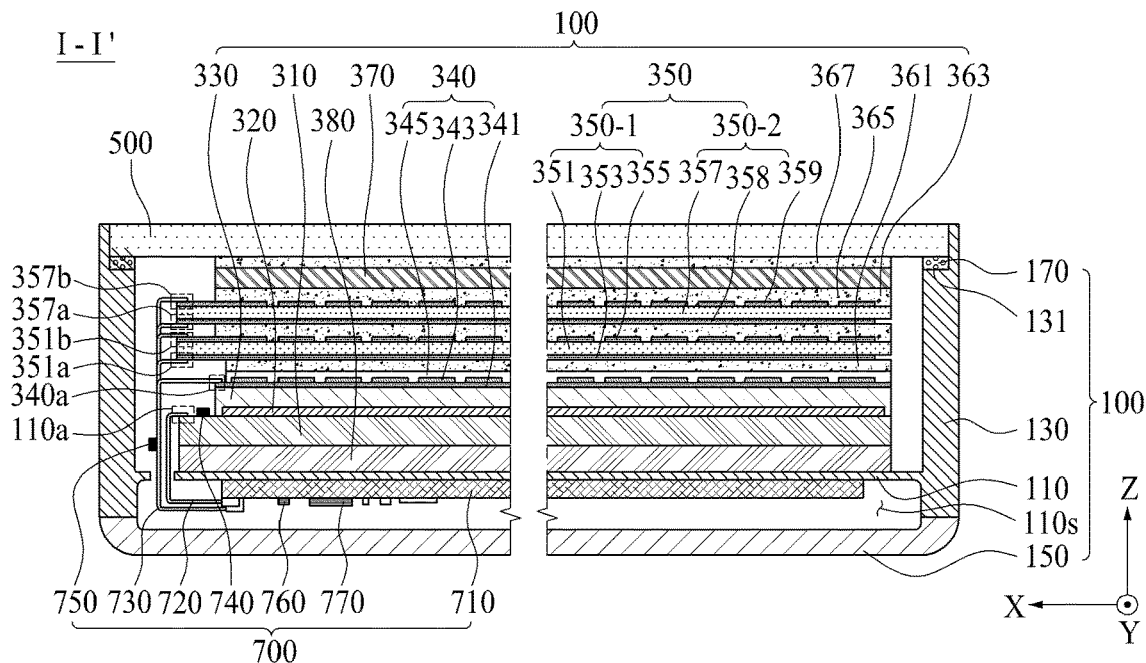
FIG. 15 is a cross sectional view along I-I' line of FIG. 1 according to an embodiment of the present disclosure.

FIG. 15 is a cross sectional view along I-I' line of FIG. 1, which is obtained by changing the structure of the touch sensing layer. Hereinafter, only the touch sensing layer and its related structures will be described in detail as follows.

Referring to FIG. 15, the touch sensing layer 350 of the electronic device according to the embodiment of the present disclosure can include a first touch sensing portion 350-1, and a second touch sensing portion 350-2.

The first touch sensing portion 350-1 is prepared on an upper surface of the shielding layer 340, in which the first touch sensing portion 350-1 serves as a force sensor for sensing the force touch of the touch input object. That is, the first touch sensing portion 350-1 can be a force sensing panel attached to the upper surface of the shielding layer 340 by the use of first transparent adhesive member 361. Except for that the first touch sensing portion 350-1 serves as the force sensor, the first touch sensing portion 350-1 has the same structure as the touch sensing layer 350 shown in FIGS. 1 to 4, whereby a detailed description for the first touch sensing portion 350-1 will be omitted.

The first touch sensing portion 350-1 can include a pressure response member 351, a first touch electrode layer 353 prepared on a first surface of the pressure response member 351, and a second touch electrode layer 355 having a plurality of second touch electrodes prepared on a second surface of the pressure response member 351.

The first touch electrode layer 353 can include a plurality of first touch electrodes prepared at fixed intervals on the first surface of the pressure response member 351, and a first force pad portion 351 prepared at the edge of the first surface of the pressure response member 351 and connected with the plurality of first touch electrodes by a one-to-one correspondence. The plurality of first touch electrodes are used as a force driving electrode (or force sensing electrode). The first force pad portion 351a can be connected with the touch driving electrode 750 by the second flexible printed circuit cable 730 or an additional third flexible printed circuit cable.

The second touch electrode layer 355 can include the plurality of second touch electrodes which are prepared at fixed intervals on the second surface of the pressure response member 351 and are perpendicular to the plurality of first touch electrodes, and a second force pad portion 351b prepared at the edge of the second surface of the pressure response member 351 and connected with the plurality of second touch electrodes by a one-to-one correspondence. The plurality of second touch electrodes are used as a force sensing electrode (or force driving electrode). The second force pad portion 351b can be connected with the touch driving electrode 750 by the second flexible printed circuit cable 730 or an additional third flexible printed circuit cable.

The second touch sensing portion 350-2 is prepared on an upper surface of the first touch sensing portion 350-1, in which the second touch sensing portion 350-2 serves as a touch sensor for sensing the touch position of the touch input object. That is, the second touch sensing portion 350-2 can be a touch sensing panel attached to the upper surface of the first touch sensing portion 350-1 by the use of second transparent adhesive member 363.

The second touch sensing portion 350-2 according to one embodiment of the present disclosure can include a base member 357, a third touch electrode layer 358 prepared on a first surface of the base member 357, and a fourth touch electrode layer 359 prepared on a second surface of the base member 357.

The base member 357 is formed of a transparent plastic material.

The third touch electrode layer 358 can include a plurality of third touch electrodes prepared at fixed intervals on the first surface of the base member 357, and a first touch pad portion 357 prepared at the edge of the first surface of the base member 357 and connected with the plurality of third touch electrodes by a one-to-one correspondence. The plurality of third touch electrodes are used as a touch driving electrode (or touch sensing electrode). The first touch pad portion 357a can be connected with the touch driving circuit 750 by the second flexible printed circuit cable 730 or an additional fourth flexible printed circuit cable.

The fourth touch electrode layer 359 can include a plurality of fourth touch electrodes which are prepared at fixed intervals on the second surface of the base member 357 and are perpendicular to the plurality of third touch electrodes, and a second touch pad portion 357b prepared at the edge of the second surface of the base member 357 and connected with the plurality of fourth touch electrodes by a one-to-one correspondence. The plurality of fourth touch electrodes are used as a touch sensing electrode (or touch driving electrode). The second touch pad portion 357b can be connected with the touch driving electrode 750 by the second flexible printed circuit cable 730 or an additional fourth flexible printed circuit cable.

The upper surface of the touch sensing layer 350 is connected with the polarizing layer 370. That is, the polarizing layer 370 is attached to the upper surface of the touch sensing layer 350 by the use of third transparent adhesive member 365.

Meanwhile, the touch driving circuit 750 according to the embodiment of the present disclosure senses the force touch and the touch sensing of the touch input object by the touch sensing layer 350 of the display module 300 in response to the touch synchronization signal supplied from the touch control circuit 760.

For the touch sensing period, as shown in FIG. 5A, the touch driving circuit 750 according to one embodiment of the present disclosure applies the touch driving signal (TDS) to at least one among the plurality of touch driving electrodes, and generates the touch sensing data by sensing the change of capacitance of the touch sensor (TS) formed in the second touch sensing portion 350-2 in accordance with the touch of the touch input object by the plurality of touch sensing electrodes. For example, for the touch sensing period, the touch driving circuit 750 sequentially applies the touch driving signal (TDS) to the plurality of third touch electrodes (TE3), generates the touch sensing data by sensing the change of capacitance in the touch sensor (TS) formed between the third touch electrode (TE3) and the fourth touch electrode (TE4) by the plurality of fourth touch electrodes (TE4), and provides the touch sensing data to the touch control circuit 760.

For the touch sensing period, simultaneously, the touch driving circuit 750 applies the force driving voltage (FDV) to at least one among the plurality of force driving electrodes, as shown in FIG. 5B, and generates the force sensing data by sensing the voltage change of the force sensor (FS) formed in the pressure response member 351 of the first touch sensing portion 350-1 in accordance with the touch force of the touch input objet through the plurality of touch sensing electrodes. For example, for the touch sensing period, the touch driving circuit 750 sequentially applies the force driving voltage (FDV) to the plurality of first touch electrodes (TE1), generates the force sensing data by sensing the voltage change of the force sensor (FS) through the plurality of second touch electrodes (TE2), and provides the force sensing data to the touch control circuit 760.

The touch control circuit 760 according to one embodiment of the present disclosure generates the touch synchronization signal, controls the driving of the touch driving circuit 750, generates the touch position coordinates (or 2D touch information) based on the touch sensing data provided from the touch driving circuit 750, generates the touch force level (or 3D touch information) based on the force sensing data, and provides the touch position coordinates and the touch force level to the system controller 770. Accordingly, the system controller 770 executes an application program or an application program function corresponding to the 2D touch information and/or 3D touch information provided from the touch control circuit 760, e.g., a program shortcut icon.

Figure 16:
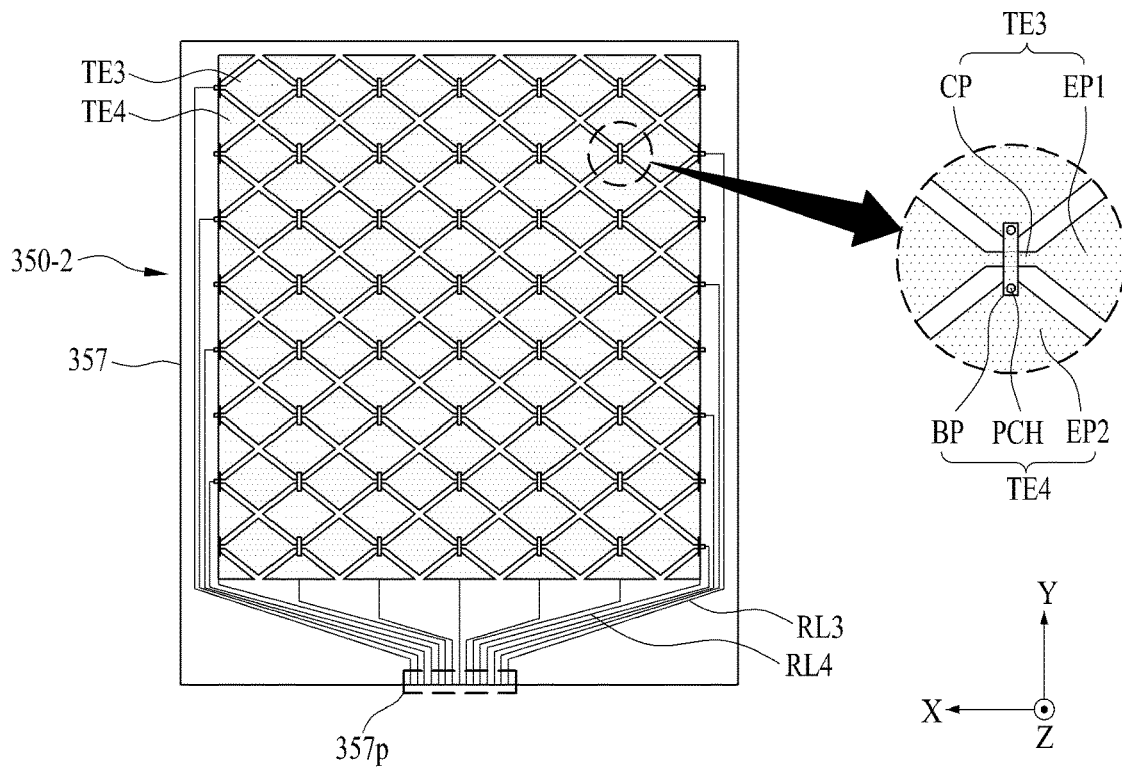
FIGS. 16 and 17 illustrate modified examples of a second touch sensing portion shown in FIG. 15.

FIG. 16 illustrates a modified example of the second touch sensing portion shown in FIG. 15.

Referring to FIG. 16, the second touch sensing portion 350-2 according to the embodiment of the present disclosure has a mutual capacitive type touch electrode structure. That is, the second touch sensing portion 350-2 according to the embodiment of the present disclosure can include a base member 357, a plurality of third touch electrodes (TE3), a plurality of fourth touch electrodes (TE4), and a touch pad portion 357p.

The base member 357 is formed of a transparent plastic material. The base member 357 is attached to an upper surface of the shielding layer 340 by the use of first transparent adhesive member.

The plurality of third touch electrodes (TE3) are used as a touch driving electrode (or touch sensing electrode). The plurality of third touch electrodes (TE3) are prepared on a front surface of the base member 357, and are formed of a transparent conductive material. The plurality of third touch electrodes (TE3) are provided at fixed intervals along the second horizontal axis direction (Y) while being parallel to the first horizontal axis direction (X).

The plurality of third touch electrodes (TE3) can include a plurality of first electrode patterns (EP1) prepared at fixed intervals along the first horizontal axis direction (X), and a plurality of connection patterns (CP) for electrically connecting the first electrode patterns (EP1) adjoining in the first horizontal axis direction with each other. In this instance, each of the plurality of first electrode patterns (EP1) can have a rectangular shape, an octagonal shape, a circle shape, or a diamond shape, and each of the plurality of connection patterns (CP) can have a bar shape.

Each of the plurality of fourth touch electrodes (TE4) is used as a touch sensing electrode (or touch driving electrode) The plurality of fourth touch electrodes (TE4) are prepared on the front surface of the base member 357, and are formed of a transparent conductive material. The plurality of fourth touch electrodes (TE4) are provided at fixed intervals along the first horizontal axis direction (X) while being parallel to the second horizontal axis direction (Y).

The plurality of fourth touch electrodes (TE4) can include a plurality of second electrode patterns (EP2) prepared at fixed intervals along the second horizontal axis direction (Y), and a plurality of bridge patterns (BP) for electrically connecting the second electrode patterns (EP2) adjoining in the second horizontal axis direction with each other.

The plurality of second electrode patterns (EP2) are prepared on the front surface of the base member 357 corresponding to the portion between the first electrode patterns (EP1) adjoining in the second horizontal axis direction (Y), in which the shape of the second electrode pattern (EP2) is the same as the shape of the first electrode pattern (EP1). In this instance, the connection pattern (CP) in each of the plurality of third touch electrodes (TE3), which is prepared between each of the plurality of second electrode patterns (EP2), electrically separates the second electrode patterns (EP2) adjoining along the second horizontal axis direction (Y) from each other.

The plurality of first electrode patterns (EP1) and the plurality of second electrode patterns (EP2) are prepared on the same plane of the front surface of the base member 357 while being arranged to have a checkered pattern.

The plurality of bridge patterns (BP) and the second electrode pattern (EP2) are prepared at the different layers, and are provided to electrically connect the adjoining two of second electrode patterns (EP2) to each other with the connection pattern (CP) of the third touch electrode (TE3) provided in-between along the second horizontal axis direction (Y). In this instance, the plurality of bridge patterns (BP) are electrically insulated from the connection pattern (CP) of the third touch electrode (TE3) by a touch insulating layer. The touch insulating layer, which is prepared on the entire front surface of the base member 357, covers the plurality of third touch electrodes (TE3), and the plurality of second electrode patterns (EP2).

Both ends of each of the plurality of bridge patterns (BP) electrically connect the adjoining two of second electrode patterns (EP2) through a pattern contact hole (PCH) prepared in the touch insulating layer overlapped with the edge of each of the adjoining two of second electrode patterns (EP2) with the connection pattern (CP) provided in-between along the second horizontal axis direction (Y). Thus, the adjoining two of second electrode patterns (EP2) with the connection pattern (CP) of the third touch electrode (TE3) provided in-between along the second horizontal axis direction (Y) are electrically connected with each other by the plurality of bridge patterns (BP), to thereby form one of the fourth touch electrode (TE4).

The touch pad portion 357p can include a plurality of first pad electrodes and a plurality of second pad electrodes prepared at one edge of the base member 357. Each of the plurality of first pad electrodes is connected with the other end of each of a plurality of third touch routing lines (RL3) by a one-to-one correspondence. Each of the plurality of second pad electrodes is connected with the other end of each of a plurality of fourth touch routing lines (RL4) by a one-to-one correspondence. The touch pad portion 357p is connected with the touch driving circuit 750.

As shown in FIG. 5A, for the touch sensing period, the touch driving circuit 750 according to one embodiment of the present disclosure applies the touch driving signal (TDS) to at least one among the plurality of touch driving electrodes, and generates the touch sensing data by sensing the change of capacitance in the touch sensor (TS) formed in the second touch sensing portion 350-2 in accordance with the touch of the touch input object through the plurality of touch sensing electrodes. For example, for the touch sensing period, the touch driving circuit 750 sequentially applies the touch driving signal (TDS) to the plurality of third touch electrodes (TE3), generates the touch sensing data by sensing the change of capacitance in the touch sensor (TS) formed between the third touch electrode (TE3) and the fourth touch electrode (TE4) through the plurality of fourth touch electrodes (TE4), and provides the touch sensing data to the touch control circuit 760.

In the electronic device including the second touch sensing portion 350-2 according to the embodiment of the present disclosure, the plurality of third touch electrodes (TE3) and the plurality of fourth touch electrodes (TE4) are provided on the same plane of the base member 357 so that it is possible to reduce the thickness of the electronic device.

Figure 17:
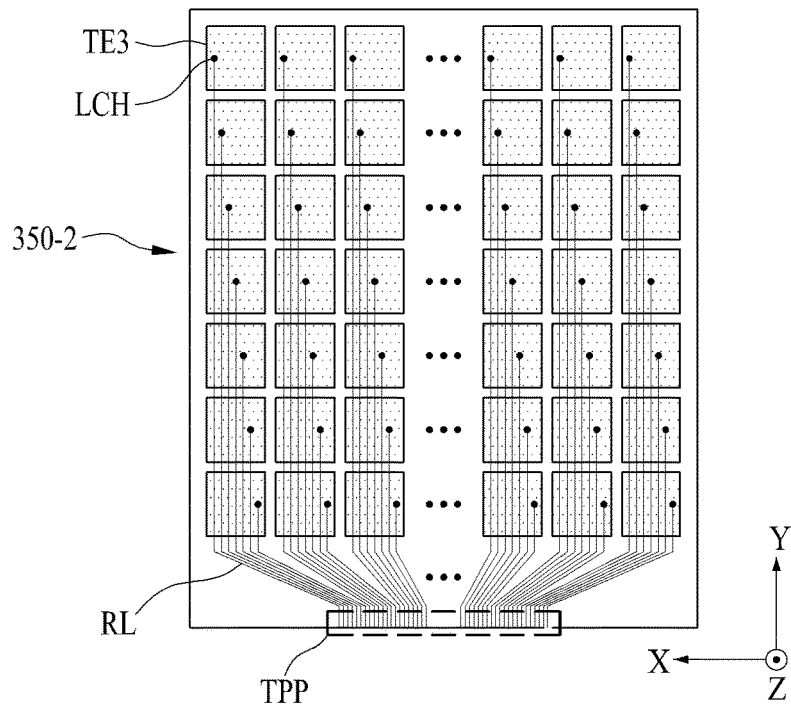

FIG. 17 illustrates another modified example of the second touch sensing portion shown in FIG. 15.

Referring to FIG. 17, the second touch sensing portion 350-2 according to the embodiment of the present disclosure has a self-capacitive type touch electrode structure. That is, the second touch sensing portion 350-2 according to the embodiment of the present disclosure can include a base member 357, a plurality of third touch electrodes (TE3), an insulating layer, a plurality of touch routing lines (RL), and a touch pad portion (TPP).

The base member 357 is formed of a transparent plastic material. The base member 357 is attached to an upper surface of the shielding layer 340 by the use of first transparent adhesive member.

The plurality of third touch electrodes (TE3) are provided at fixed intervals along the first horizontal axis direction (Y) and the second horizontal axis direction (Y). The plurality of third touch electrodes (TE3) are used as both a touch driving electrode and a touch sensing electrode.

Each of the plurality of third touch electrodes (TE3) can be overlapped with a preset number of pixels (XP). In this instance, a size in each of the plurality of third touch electrodes (TE3) can be changed in accordance with a size of a display panel (or resolution) and a touch resolution. Also, the plurality of third touch electrodes (TE3) are arranged in a grid shape, in which the plurality of third touch electrodes (TE3) may not be identical in size. For example, the size in the touch electrode disposed at the edge of the base member 357 can be smaller than the size in the touch electrode disposed at the center of the base member 357. In this instance, it is possible to enhance uniformity in touch sensitivity between the center of the second touch sensing portion 350-2 and the edge of the second touch sensing portion 350-2.

The insulating layer covers the entire front surface of the base member 357 including the plurality of third touch electrodes (TE3).

The plurality of touch routing lines (RL) are connected with the plurality of third touch electrodes (TE3) by a one-to-one correspondence, to thereby connect the plurality of touch routing lines (RL) with the touch pad portion (TPP).

The plurality of touch routing lines (RL) are prepared on the insulating layer while being overlapped with at least one of the third touch electrode (TE3) provided in the second horizontal axis direction (Y), and are connected with the plurality of third touch electrodes (TE3) provided in the second horizontal axis direction (Y) through the line contact hole (LCH) by a one-to-one correspondence. In this instance, one end in each of the plurality of touch routing lines (RL) is electrically connected with the corresponding third touch electrode (TE3), and the other end in each of the plurality of touch routing lines (RL) is electrically connected with the touch pad portion (TPP).

The touch pad portion (TPP) can include a plurality of pad electrodes prepared at one edge of the base member 357. Each of the plurality of pad electrodes is connected with the other end in each of the plurality of touch routing lines (RL) by a one-to-one correspondence. The touch pad portion (TPP) is connected with the touch driving circuit 750.

For the touch sensing period, the touch driving circuit 750 according to one embodiment of the present disclosure generates the touch driving signal, simultaneously applies the touch driving signal to the plurality of third touch electrodes (TE3) through the plurality of touch routing lines (RL), generates the touch sensing data by sequentially or simultaneously sensing the change of capacitance in the plurality of third touch electrodes (TE3) through the plurality of touch routing lines (RL), and provides the touch sensing data to the touch control circuit 760.

Selectively, the plurality of touch routing lines (RL) can be prepared on the base member 357, and the plurality of touch routing lines (RL) and the third touch electrode (TE3) can be prepared at the same layer. For example, with respect to the first horizontal axis direction (X), the plurality of touch routing lines (RL) are directly provided on the upper surface of the base member 357 while being adjacent to the plurality of third touch electrodes (TE3), and are connected with the plurality of third touch electrodes (TE3) by a one-to-one correspondence. That is, the plurality of touch routing lines (RL) and the plurality of third touch electrodes (TE3) are patterned at the same time, whereby the plurality of touch routing lines (RL) and the plurality of third touch electrodes (TE3) can be prepared at the same layer on the base member 357. In this instance, it is possible to omit the line contact hole (LCH).

Accordingly, the electronic device including the second touch sensing portion 350-2 according to the embodiment of the present disclosure has the self-capacitive type touch electrode structure so that it is possible to reduce the thickness of the electronic device.

Additionally, in the same manner as the polarizing layer of FIG. 6, the polarizing layer 370 can be interposed between the shielding layer 340 and the touch sensing layer 350. That is, a first surface of the polarizing layer 370 is attached to the shielding layer 340 by the use of transparent adhesive member, and a second surface of the polarizing layer 370 is attached to the first touch sensing portion 350-1 of the touch sensing layer 350 by the use of transparent adhesive member.

Additionally, the display module 300 according to the embodiment of the present disclosure can further include a black matrix layer, a color filter layer, and a buffer layer prepared between the encapsulation layer 330 and the shielding layer 340. The black matrix layer, the color filter layer, and the buffer layer are the same as those shown in FIG. 8, whereby a detailed description for the black matrix layer, the color filter layer, and the buffer layer will be omitted.

Selectively, the touch sensing layer 350 of the display module 300 according to the embodiment of the present disclosure is not attached to the shielding layer 340 by an attachment process using a transparent adhesive member. As shown in FIGS. 9 to 13, the touch sensing layer 350 can be directly provided on the upper surface of the shielding layer 340 without using the transparent adhesive member.

The first touch sensing portion 350-1 of the touch sensing layer 350 can include a first touch electrode layer 353 having a plurality of first touch electrodes directly provided on the insulating layer 345 of the shielding layer 340, a pressure response member 351 coated onto the insulating layer 345 of the shielding layer 340 so as to cover the first touch electrode layer 353, a second touch electrode layer 355 having a plurality of second touch electrodes directly provided on an upper surface of the pressure response member 351, and a touch insulating layer covering the entire upper surface of the pressure response member 351 including the second touch electrode layer 355. In this instance, this touch insulating layer and the insulating layer of the shielding layer 340 can be formed of the same insulating material.

The second touch sensing portion 350-2 of the touch sensing layer 350 can include a third touch electrode layer 358 having a plurality of third touch electrodes directly provided on the touch insulating layer of the first touch sensing portion 350-1, a base member 357 covering the third touch electrode layer 358, and a fourth touch electrode layer 359 having a plurality of fourth touch electrodes directly provided on an upper surface of the base member 357.

In the electronic device according to the embodiment of the present disclosure, the touch sensing layer 350 is disposed in the display module 300 so that it is possible to sense the touch position and the touch force at the same time, and also to realize the thin profile of the electronic device. Also, the shielding layer 340 is disposed between the touch sensing layer 350 and the pixel array layer 320 so that it is possible to prevent deterioration of picture quality and/or touch sensitivity caused by display noise and touch noise occurring in the display panel.

Meanwhile, in the display module 300 of the electronic device shown in FIGS. 1 to 17, the pressure response member 351 of the touch sensing layer 350 can include a piezoresistive material having a piezoresistive effect instead of the piezoelectric material having the piezoelectric effect.

The piezoresistive effect indicates that an electrical resistance (or resistivity) of a material is changed in accordance with a charge transfer to a conduction band due to a conduction energy generated by an applied pressure or force. This piezoresistive effect which causes a change only in electrical resistance is different from the piezoelectric effect which causes a change in electrical potential.

The piezoresistive material can be metal, semiconductor, conductive polymer, or conductive composite. If using rubber corresponding to the conductive composite, in which a Young's modulus of rubber is relatively lower than those of other materials, it shows high flexibility owing to the properties of rubber. Thus, it may be used as the material of sensing the touch force. In addition, since rubber has high elasticity, rubber can be restored to its original shape even in case of repetitive deformations. If using silicon rubber corresponding to the conductive composite, it shows the heat-resisting, cold-resisting, weather-resisting, and water-resisting properties. Thus, if rubber includes conductive filler, it shows the piezoresistive effect.

The piezoresistive material can include polymer and conductive filler. The polymer can include rubber or silicon rubber.

The conductive filler can include any one among a metal material, a semiconductor metal oxide, and a carbon-based material. For example, the metal material can be nickel (Ni), copper (Cu), argentums (Ag), aluminum (Al), or ferrum (Fe). The semiconductor metal oxide can be vanadium oxide (V2O3), or titanium oxide (TiO). The carbon-based material can be carbon black, graphite, graphene, or carbon nanotube (CNT).

Figure 18:
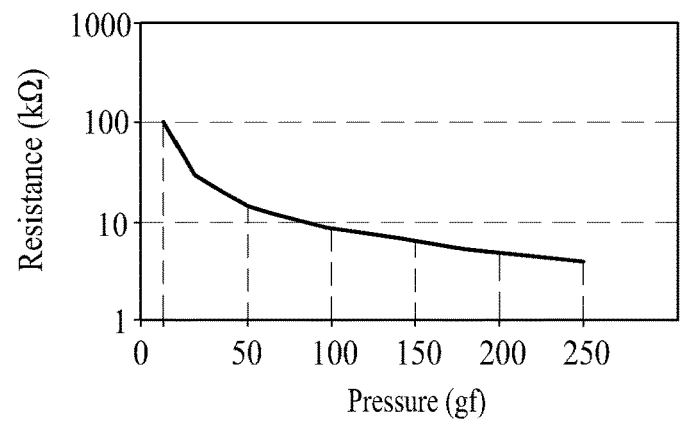
FIG. 18 is a graph illustrating a resistance change in accordance with a pressure applied to a pressure response member according to one embodiment of the present disclosure.

As shown in FIG. 18, in case of the piezoresistive material, its resistance value is gradually lowered in accordance with the increase of the applied pressure. Accordingly, the pressure response member 351 of the touch sensing layer 350 including the piezoresistive material can be used as the force sensor whose resistance value is changed in accordance with the touch force (or touch pressure) of the touch input object by the piezoresistive effect. The resistance of the force sensor formed in the pressure response member 351 based on the touch force is reduced in accordance with the increase of the touch force. Thus, the touch force level can be sensed by a touch force level calculating algorithm that models the change of voltage in accordance with the reduced resistance of the force sensor based on the force touch of the touch input object.

Figure 19:
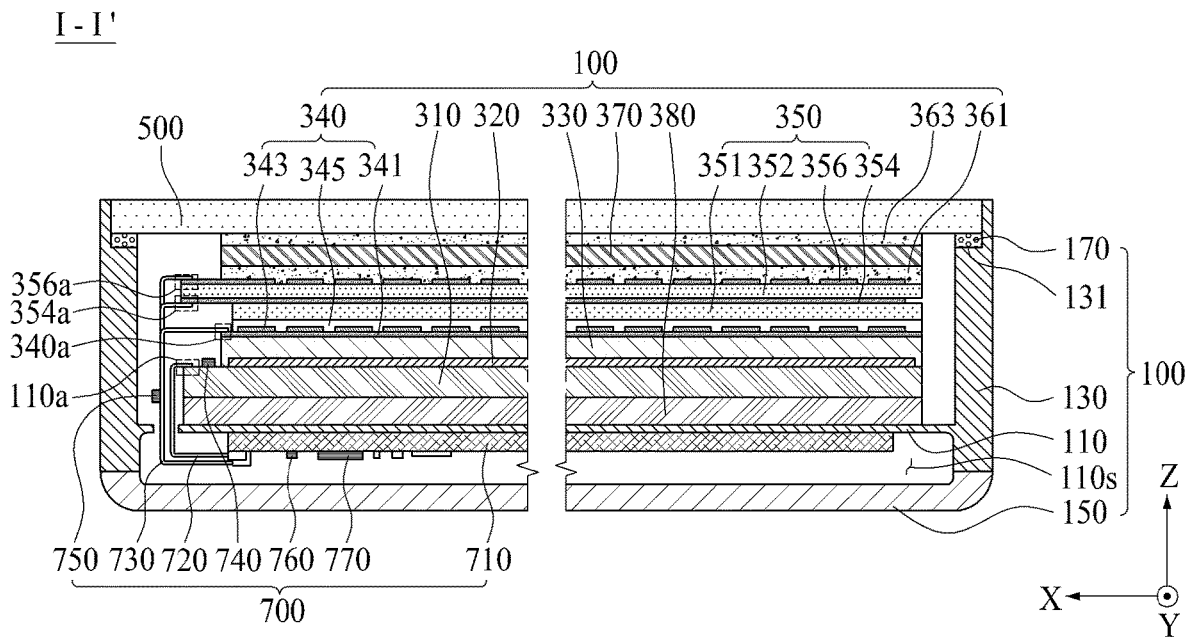
FIG. 19 is a cross sectional view along I-I' line of FIG. 1 according to an embodiment of the present disclosure.

FIG. 19 is a cross sectional view along line of FIG. 1, which is obtained by changing the structure of the touch sensing layer. Hereinafter, only the touch sensing layer and its related structures will be described in detail as follows.

Referring to FIG. 19, the touch sensing layer 350 of the electronic device according to the embodiment of the present disclosure is prepared on the shielding layer 340, in which the touch sensing layer 350 can serve as a touch screen for sequentially sensing the touch position and the touch force level in accordance with the touch of the touch input object on the cover window 500.

First, the shielding layer 340 is prepared on the upper surface of the encapsulation layer 330 so that it is possible to prevent environmental noise and display noise and touch noise occurring in the display panel from flowing into the touch sensing layer 350 and/or pixel array layer 320. The shielding layer 340 provides the above noise-prevention function, and the shielding layer 340 is used as the force driving electrode or the force sensing electrode for sensing the touch force in accordance with the touch of the touch input object.

The touch sensing layer 350 can include a pressure response member 351, a base member 352, a first touch electrode layer 354, and a second touch electrode layer 356.

The pressure response member 351 covers the upper surface of the shielding layer 340. According the electrical properties of the pressure response member 351 is changed in accordance with the touch force (or touch pressure) of the touch input object, the pressure response member 351 is used as the pressure response sensor for sensing the touch force of the touch input object.

The pressure response member 351 can be prepared at a constant thickness on the insulating layer 345 of the shielding layer 340 by a coating and curing process using the solution of the piezoelectric material having the piezoelectric effect. Except for the pressure response member 351 being directly coated onto the upper surface of the shielding layer 340, the pressure response member 351 is formed of the same piezoelectric material as that of the aforementioned embodiment.

The base member 352 is formed of a transparent plastic material, which supports the first touch electrode layer 354 and the second touch electrode layer 356.

The first touch electrode layer 354 can include a plurality of first touch electrodes prepared at fixed intervals on a first surface of the base member 352, and a first touch pad portion 354a prepared at the edge of the first surface of the base member 352 and connected with the plurality of first touch electrodes by a one-to-one correspondence. Each of the plurality of first touch electrodes is used as a touch driving electrode, a force driving electrode, or a force sensing electrode. The first touch pad portion 354a is connected with the touch driving circuit 750 through the second flexible printed circuit cable 730 or an additional third flexible printed circuit cable.

The second touch electrode layer 356 can include a plurality of second touch electrodes which are prepared at fixed intervals on a second surface of the base member 352 and are perpendicular to the plurality of first touch electrodes, and a second touch pad portion 356a prepared at the edge of the second surface of the base member 352 and connected with the plurality of second touch electrodes by a one-to-one correspondence. The plurality of second touch electrodes are used as a touch sensing electrode. The second touch pad portion 356a can be connected with the touch driving electrode 750 by the second flexible printed circuit cable 730 or the additional third flexible printed circuit cable.

The upper surface of the touch sensing layer 350 is connected with the polarizing layer 370. That is, the polarizing layer 370 is attached to the upper surface of the touch sensing layer 350 by the use of first transparent adhesive member 361.

In response to the touch synchronization signal supplied from the touch control circuit 760, the touch driving circuit 750 according to one embodiment of the present disclosure drives the touch sensing layer 350 of the display module 300 by a time-division method including a first touch sensing period and a second touch sensing period. In this instance, the first touch sensing period can be defined as a touch position sensing period for sensing a touch event and touch position of the touch input object, and a second touch sensing period can be defined as the touch force sensing period for sensing the touch force of the touch input object. For example, the first touch sensing period can be the period corresponding to a first logic state of the touch synchronization signal, and the second touch sensing period can be the period corresponding to a second logic state of the touch synchronization signal.

Figure 20A:
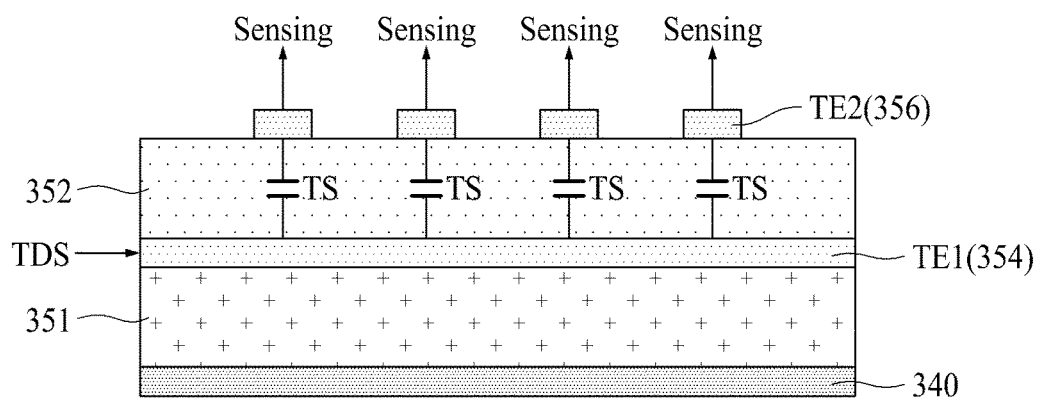
FIGS. 20A, 20B, and 20C are cross sectional views illustrating a method of driving a touch sensing layer shown in FIG. 19.

For the first touch sensing period, as shown in FIG. 20A, the touch driving circuit 750 applies the touch driving signal (TDS) to at least one among the plurality of touch driving electrodes, and senses the change of capacitance in the touch sensor (TS) formed between first touch electrode (TE1) and the second touch electrode (TE2) in accordance with the touch of the touch input object through the plurality of touch sensing electrodes, to thereby generate the touch sensing data. For example, for the first touch sensing period, the touch driving circuit 750 sequentially applies the touch driving signal (TDS) to the plurality of first touch electrodes (TE1), generates the touch sensing data by sensing the change of capacitance in the touch sensor (TS) through the plurality of second touch electrodes (TE2), and provides the touch sensing data to the touch control circuit 760. For the first touch sensing period, the touch driving circuit 750 makes the shielding layer 340 be electrically floating or electrically grounded.

Figure 20B:
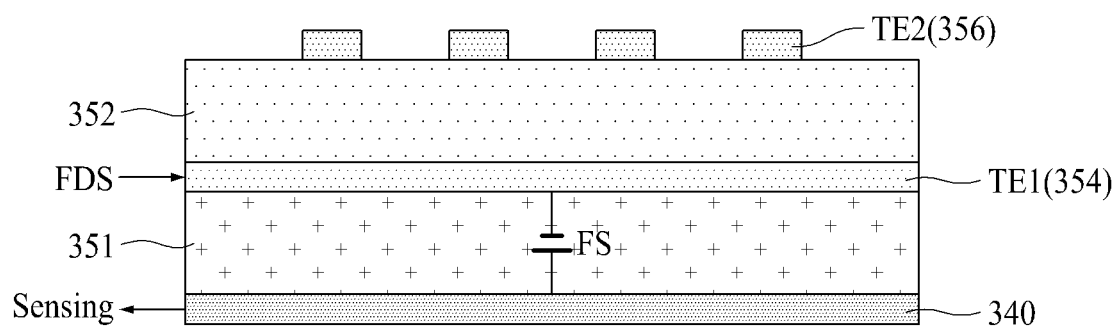

For the second touch sensing period, as shown in FIG. 20B, the touch driving circuit 750 according to one embodiment of the present disclosure applies the force driving voltage (FDV) to at least one among the plurality of touch driving electrodes, and senses the change of voltage in the force sensor (FS), which is formed in the pressure response member 351 of the touch sensing layer 350 in accordance with the touch force of the touch input object, through the shielding layer 340, to thereby generate the force sensing data. In this instance, the force driving voltage (FDV) applied to the touch driving electrode and the change of voltage in the force sensor (FS) in accordance with the touch force of the touch input object are induced to the transparent conductive layer 341 of the shielding layer 340, whereby the touch driving circuit 750 senses the voltage induced to the transparent conductive layer 341 of the shielding layer 340, to thereby generate the force sensing data. For example, for the second touch sensing period, the touch driving circuit 750 sequentially applies the force driving voltage (FDV) to the plurality of first touch electrodes (TE1), generates the force sensing data by sensing the change of voltage in the force sensor (FS) through the shielding layer 340, and provides the force sensing data to the touch control circuit 760. For the second touch sensing period, the touch driving circuit 750 makes the plurality of second touch electrodes (TE2) be electrically floating or electrically grounded.

Figure 20C:
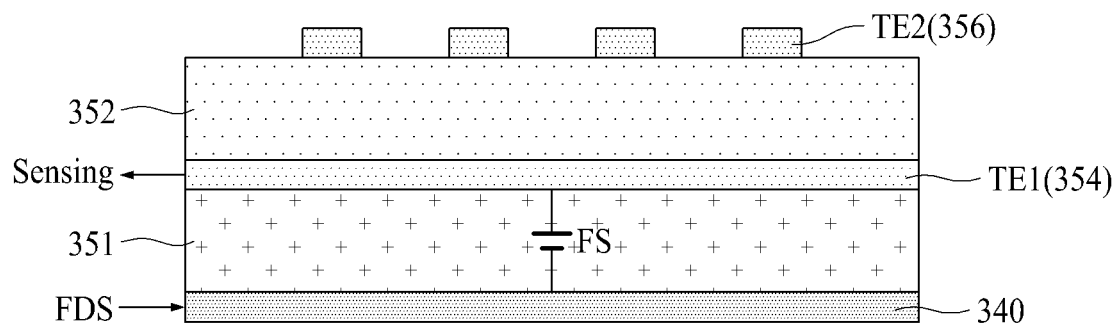

For the second touch sensing period, as shown in FIG. 20C, the touch driving circuit 750 according to another embodiment of the present disclosure applies the force driving voltage (FDV) to the shielding layer 340, and generates the force sensing data by sensing the voltage change of the force sensor (FS) formed in the pressure response member 351 of the touch sensing layer 350 in accordance with the touch force of the touch input object through the plurality of first touch electrodes (TE1). For the second touch sensing period, the touch driving circuit 750 makes the plurality of second touch electrodes (TE2) be electrically floating or electrically grounded. If the force driving voltage (FDV) is applied to the shielding layer 340, the force driving voltage (FDV) is applied to one force driving electrode so that it is possible to simplify the structure of the touch driving circuit 750 supplied with the force driving voltage (FDV).

In order to shorten the second touch sensing period and/or reduce power consumption of the second touch sensing period, selectively, the touch driving circuit 750 senses the touch force only for the touch event area of the first touch sensing period. That is, the touch driving circuit 750 firstly performs the touch position sensing by the global touch sensing or group touch sensing under the control of the touch control circuit 760, and secondly performs the touch force sensing only for the touch event area by the local force touch sensing under the control of the touch control circuit 760. For example, the touch driving circuit 750 applies the force driving voltage (FDV) to at least one force driving electrode included in the touch event area for the second touch sensing period, and senses the voltage change of the force sensor (FS) formed in the pressure response member 351 of the touch sensing layer 350 through at least one force sensing electrode included in the touch event area in accordance with the force touch of the touch input object, to thereby generate the force sensing data. In this instance, the touch force sensing is locally executed for the touch event area sensed for the first touch sensing period so that it is possible to shorten the second touch sensing period and to reduce the power consumption of the second touch sensing period.

The touch control circuit 760 according to one embodiment of the present disclosure generates the touch synchronization signal, controls the driving of the touch driving circuit 750, generates the touch position coordinates (or 2D touch information) based on the touch sensing data provided from the touch driving circuit 750, generates the touch force level (or 3D touch information) based on the force sensing data, and provides the touch position coordinates and the touch force level to the system controller 770. Accordingly, the system controller 770 executes an application program or an application program function corresponding to the 2D touch information and/or 3D touch information provided from the touch control circuit 760, e.g., a shortcut icon for a program or function.

Additionally, the display module 300 according to the embodiment of the present disclosure can further include a black matrix layer, a color filter layer, and a buffer layer prepared between the encapsulation layer 330 and the shielding layer 340. The black matrix layer, the color filter layer, and the buffer layer are the same as those shown in FIG. 8, whereby a detailed description for the black matrix layer, the color filter layer, and the buffer layer will be omitted.

The electronic device according to the embodiment of the present disclosure provides the same effect as that of the electronic device shown in FIGS. 1 to 6, and the shielding layer 340 is used as the electrode for sensing the force touch of the touch input object so that it is possible to simplify the structure of the touch sensing layer 350.

FIG. 1 shows that the electronic device according to the embodiment of the present disclosure is applied to a smart phone, but not limited to this type. For example, the electronic device according to the embodiment of the present disclosure can be applied to various fields of television, notebook, monitor, camera, camcorder, or home appliances with display as well as mobile devices of electronic notebook, electronic book, PMP (portable multimedia player), navigation, mobile phone, tablet PC (personal computer), smart watch, watch phone, wearable device, and mobile communication terminal.

According to the embodiment of the present disclosure, it is possible to realize the thin profile of the electronic device, and to sense both the touch position and the touch force. Also, it is possible to prevent deterioration of picture quality and/or touch sensitivity caused by the display noise and touch noise occurring in the display panel.

It will be apparent to those skilled in the art that various modifications and variations can be made to embodiments of the present disclosure without departing from the spirit or scope of the invention. Thus, it is intended that the present disclosure covers the modifications and variations of this invention provided they come within the scope of the appended claims and their equivalents.

What is claimed is:

1. An electronic device comprising:
    a pixel array layer disposed on a substrate and including a plurality of pixels, each of the plurality of pixels including a thin film transistor and an organic light emitting device;
    an encapsulation layer covering the pixel array layer;
    a shielding layer disposed on the encapsulation layer; and
    a touch sensing layer disposed on the shielding layer, the touch sensing layer including:
        first and second touch electrodes configured to sense coordinates of a touch input, and
        a pressure response member disposed between the first and second touch electrodes, the pressure response member configured to deform to sense a force level of the touch input,
    wherein the first touch electrode directly contacts a lower surface of the pressure response member, and the second touch electrode directly contacts an upper surface of the pressure response member,
    wherein the shielding layer is disposed between the touch sensing layer and the encapsulation layer,
    wherein the shielding layer includes:
        a transparent conductive layer disposed on an upper surface of the encapsulation layer;
        a metal pattern layer disposed on the transparent conductive layer; and
        an insulating layer disposed on the transparent conductive layer and covering the metal pattern layer,
    wherein the second touch electrode includes a plurality of line patterns prepared at fixed intervals on the upper surface of the pressure response member,
    wherein the metal pattern layer includes a plurality of line patterns prepared at fixed intervals on one surface of the transparent conductive layer, and
    wherein the plurality of line patterns of the second touch electrode overlap with the plurality of line patterns of the metal pattern layer and the plurality of line patterns of the second touch electrode are disposed parallel to the plurality of line patterns of the metal pattern layer.

2. The electronic device according to claim 1, wherein the touch sensing layer further includes:
    a third touch electrode disposed on a first surface of a base member; and
    a fourth touch electrode disposed on a second surface of the base member, wherein the second surface of the base member is opposite the first surface of the base member.

3. The electronic device according to claim 2, further comprising a touch driving circuit connected to the touch sensing layer and configured to:
    supply a touch driving signal to one of the third touch electrode and the fourth touch electrode, and sense touch sensing data through the other one of the third touch electrode and the fourth touch electrode, and
    supply a force driving voltage to one of the first touch electrode and the second touch electrode, and sense force sensing data through the other one of the first touch electrode and the second touch electrode.

4. The electronic device according to claim 3, wherein the touch sensing data and the force sensing data are sensed simultaneously or independently.

5. The electronic device according to claim 1, further comprising a touch driving circuit connected to the touch sensing layer and configured to:
    supply a touch driving signal to one of the first touch electrode and the second touch electrode during a first touch sensing period, and sense touch sensing data through the other one of the first touch electrode and the second touch electrode during the first touch sensing period, and
    supply a force driving voltage to one of the first touch electrode and the second touch electrode during a second touch sensing period, and sense force sensing data through the other one of the first touch electrode and the second touch electrode during the second touch sensing period.

6. The electronic device according to claim 1, wherein the touch sensing layer includes:
    the pressure response member disposed on the shielding layer;
    a first touch electrode disposed between the pressure response member and a base member; and
    a second touch electrode disposed on the base member.

7. The electronic device according to claim 6, further comprising a touch driving circuit connected to the touch sensing layer and configured to:
    supply a touch driving signal to one of the first touch electrode and the second touch electrode during a first touch sensing period, and sense touch sensing data through the other one of the first touch electrode and the second touch electrode during the first touch sensing period, and
    supply a force driving voltage to one of the first touch electrode and the shielding layer during a second touch sensing period, and sense force sensing data through the other one of the first touch electrode and the shielding layer during the second touch sensing period.

8. The electronic device according to claim 1, wherein the shielding layer includes a conductive material for shielding the touch sensing layer from electrical noise from the pixel array layer or for shielding the pixel array layer from electrical noise from the touch sensing layer.

9. The electronic device according to claim 1, wherein the metal pattern layer includes a mesh pattern, a plurality of line patterns prepared at fixed intervals on one surface of the transparent conductive layer, or a plurality of concentric closed loop patterns.

10. The electronic device according to claim 1, wherein the insulating layer covers a lateral surface of the metal pattern layer, a lateral surface of the transparent conductive layer, and a lateral surface of the encapsulation layer.

11. The electronic device according to claim 1, wherein the shielding layer is electrically floating or grounded.

12. The electronic device according to claim 1, further comprising a polarizing layer disposed between the touch sensing layer and a cover window or between the shielding layer and the touch sensing layer.

13. The electronic device according to claim 1, wherein the pressure response member includes a transparent piezoelectric material.

14. The electronic device according to claim 1, further comprising:
 a color filter layer disposed between the encapsulation layer and the shielding layer; and
 a black matrix disposed between the encapsulation layer and the shielding layer,
 wherein the black matrix defines an opening area of the pixel array layer, and the color filter layer overlaps with the opening area, and
 wherein the color filter layer and the black matrix are located at a same layer.

15. An electronic device comprising:
 a housing having a receiving space;
 a display module disposed in the receiving space;
 a cover window supported by the housing and covering the display module,
 wherein the display module includes:
  a pixel array layer disposed on a substrate and including a plurality of pixels, each of the plurality of pixels including a thin film transistor and an organic light emitting device;
  an encapsulation layer covering the pixel array layer;
  a shielding layer disposed on the encapsulation layer; and
  a touch sensing layer disposed on the shielding layer and including:
   first and second touch electrodes configured to sense coordinates of a touch input, and
   a pressure response member disposed between the first and second touch electrodes, the pressure response member configured to deform to sense a force level of the touch input; and
 a controller configured to:
  supply a touch driving signal to the first touch electrode and sense touch sensing data through the second touch electrode during a first touch sensing period, and
  supply a force driving voltage to the first touch electrode during a second touch sensing period, and sense force sensing data through the second touch electrode during a second touch sensing period,
 wherein at least one of the first touch electrode and the second touch electrode directly contacts a surface of the pressure response member,
 wherein the shielding layer is disposed between the touch sensing layer and the encapsulation layer,
 wherein the shielding layer includes:
  a transparent conductive layer disposed on an upper surface of the encapsulation layer;
  a metal pattern layer disposed on the transparent conductive layer; and
  an insulating layer disposed on the transparent conductive layer and covering the metal pattern layer,
 wherein the second touch electrode includes a plurality of line patterns prepared at fixed intervals on the upper surface of the pressure response member,
 wherein the metal pattern layer includes a plurality of line patterns prepared at fixed intervals on one surface of the transparent conductive layer, and
 wherein the plurality of line patterns of the second touch electrode overlap with the plurality of line patterns of the metal pattern layer and the plurality of line patterns of the second touch electrode are disposed parallel to the plurality of line patterns of the metal pattern layer.

16. The electronic device according to claim 15, further comprising:
 a color filter layer disposed between the encapsulation layer and the shielding layer; and
 a black matrix disposed between the encapsulation layer and the shielding layer,
 wherein the black matrix defines an opening area of the pixel array layer, and the color filter layer overlaps with the opening area, and
 wherein the color filter layer and the black matrix are located at a same layer.

17. An electronic device comprising:
 a housing having a receiving space;
 a display module disposed in the receiving space;
 a cover window supported by the housing and covering the display module,
 wherein the display module includes:
  a pixel array layer disposed on a substrate and including a plurality of pixels, each of the plurality of pixels including a thin film transistor and an organic light emitting device;
  an encapsulation layer covering the pixel array layer;
  a shielding layer disposed on the encapsulation layer; and
  a touch sensing layer disposed on the shielding layer and including:
   a pressure response member disposed between a first touch electrode and a second touch electrode, the pressure response member configured to deform to sense a force level of a touch input, and
   a base member disposed between a third touch electrode and a fourth touch electrode, the third and fourth touch electrodes configured to sense coordinates of the touch input; and
 a controller configured to:
  supply a touch driving signal to the third touch electrode and sense touch sensing data through the fourth touch electrode, and
  supply a force driving voltage to the first touch electrode, and sense force sensing data through the second touch electrode,
 wherein at least one of the first touch electrode and the second touch electrode directly contacts a surface of the pressure response member,
 wherein the shielding layer is disposed between the touch sensing layer and the encapsulation layer,
 wherein the shielding layer includes:
  a transparent conductive layer disposed on an upper surface of the encapsulation layer;
  a metal pattern layer disposed on the transparent conductive layer; and
  an insulating layer disposed on the transparent conductive layer and covering the metal pattern layer, wherein the second touch electrode includes a plurality of line patterns prepared at fixed intervals on the upper surface of the pressure response member, wherein the metal pattern layer includes a plurality of line patterns prepared at fixed intervals on one surface of the transparent conductive layer, and wherein the plurality of line patterns of the second touch electrode overlap with the plurality of line patterns of the metal pattern layer and the plurality of line patterns of the second touch electrode are disposed parallel to the plurality of line patterns of the metal pattern layer.

18. The electronic device according to claim 17, wherein the touch sensing data and the force sensing data are sensed simultaneously or independently.

19. The electronic device according to claim 17, further comprising:
   a color filter layer disposed between the encapsulation layer and the shielding layer; and
   a black matrix disposed between the encapsulation layer and the shielding layer,
   wherein the black matrix defines an opening area of the pixel array layer, and the color filter layer overlaps with the opening area, and
   wherein the color filter layer and the black matrix are located at a same layer.

* * * * *